United States Patent
Park et al.

(10) Patent No.: US 9,142,490 B2
(45) Date of Patent: Sep. 22, 2015

(54) INTEGRATED CIRCUIT DEVICE HAVING THROUGH-SILICON-VIA STRUCTURE AND METHOD OF MANUFACTURING THE INTEGRATED CIRCUIT DEVICE

(71) Applicants: Jae-hwa Park, Yongin-si (KR); Kwang-jin Moon, Hwaseong-si (KR); Byung-lyul Park, Seoul (KR); Suk-chul Bang, Yongin-si (KR)

(72) Inventors: Jae-hwa Park, Yongin-si (KR); Kwang-jin Moon, Hwaseong-si (KR); Byung-lyul Park, Seoul (KR); Suk-chul Bang, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/325,335

(22) Filed: Jul. 7, 2014

(65) Prior Publication Data

US 2015/0028494 A1    Jan. 29, 2015

(30) Foreign Application Priority Data

Jul. 25, 2013    (KR) .......................... 10-2013-0088247

(51) Int. Cl.
*H01L 23/48* (2006.01)
*H01L 23/52* (2006.01)

(52) U.S. Cl.
CPC ..... *H01L 23/481* (2013.01); *H01L 2224/05009* (2013.01); *H01L 2224/0557* (2013.01); *H01L 2224/06181* (2013.01); *H01L 2224/13009* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2924/13091* (2013.01); *H01L 2924/15311* (2013.01)

(58) Field of Classification Search
CPC ....................................................... H01L 23/481
USPC ........................................... 257/774, E23.011
See application file for complete search history.

(56) References Cited

U.S. PATENT DOCUMENTS

| | | | |
|---|---|---|---|
| 7,718,542 B2 | 5/2010 | Kim et al. | |
| 7,791,207 B2 | 9/2010 | Hiatt | |
| 7,884,019 B2 | 2/2011 | Jiang et al. | |
| 8,168,533 B2 | 5/2012 | Kuo | |
| 8,399,987 B2 * | 3/2013 | Kwon et al. | 257/730 |
| 2006/0148250 A1 * | 7/2006 | Kirby | 438/667 |
| 2008/0157287 A1 * | 7/2008 | Choi et al. | 257/621 |
| 2010/0225002 A1 | 9/2010 | Law et al. | |
| 2011/0143535 A1 | 6/2011 | Pares | |
| 2011/0260297 A1 | 10/2011 | Lin et al. | |
| 2012/0091593 A1 * | 4/2012 | Cheng et al. | 257/774 |
| 2012/0261827 A1 * | 10/2012 | Yu et al. | 257/774 |

(Continued)

FOREIGN PATENT DOCUMENTS

| | | |
|---|---|---|
| KR | 20090045717 A | 5/2009 |
| KR | 100967098 B1 | 7/2010 |
| KR | 20100078110 A | 7/2010 |

*Primary Examiner* — Nitin Parekh
(74) *Attorney, Agent, or Firm* — Renaissance IP Law Group LLP

(57) ABSTRACT

Provided is an integrated circuit device including a through-silicon-via (TSV) structure and a method of manufacturing the integrated circuit device. The integrated circuit device includes a semiconductor structure including a substrate and an interlayer insulating film, a TSV structure passing through the substrate and the interlayer insulating film, a via insulating film substantially surrounding the TSV structure, and an insulating spacer disposed between the interlayer insulating film and the via insulating film.

20 Claims, 17 Drawing Sheets

(56) References Cited

U.S. PATENT DOCUMENTS

| | | | |
|---|---|---|---|
| 2012/0280395 A1* | 11/2012 | Farooq et al. | 257/754 |
| 2012/0329269 A1 | 12/2012 | Arnold et al. | |
| 2013/0270713 A1* | 10/2013 | Liao et al. | 257/774 |
| 2013/0320538 A1* | 12/2013 | Jindal et al. | 257/751 |
| 2014/0151895 A1* | 6/2014 | West et al. | 257/774 |
| 2014/0225277 A1* | 8/2014 | Chang et al. | 257/774 |
| 2014/0264911 A1* | 9/2014 | Lin et al. | 257/774 |
| 2015/0021785 A1* | 1/2015 | Lin | 257/774 |

\* cited by examiner

INTEGRATED CIRCUIT DEVICE HAVING THROUGH-SILICON-VIA STRUCTURE AND METHOD OF MANUFACTURING THE INTEGRATED CIRCUIT DEVICE

CROSS-REFERENCE TO RELATED APPLICATIONS

This application claims the benefit of Korean Patent Application No. 10-2013-0088247, filed on Jul. 25, 2013, in the Korean Intellectual Property Office, the disclosure of which is incorporated herein in its entirety by reference.

BACKGROUND

The inventive concept relates to an integrated circuit device and a method of manufacturing the same, and more particularly, to an integrated circuit device having a through-silicon-via (TSV) structure and a method of manufacturing the integrated circuit device.

A 3-dimensional (3D) package where a plurality of semiconductor chips are stacked in a single semiconductor package has been actively developed. Among them, a great deal of attention has been paid to a through-silicon-via (TSV) that is a vertical electrical connection passing through a substrate or a die. In order to improve performance and reliability of a 3D package, there is a need for a device that may provide stable operating characteristics and high reliability by preventing elements such as an insulating film and a barrier film disposed around a TSV structure from being damaged or being deteriorated during the formation of the TSV structure.

SUMMARY

The inventive concept provides an integrated circuit device that may provide stable operating characteristics and high reliability by preventing elements disposed around a through-silicon-via (TSV) structure from being damaged or deteriorating.

The inventive concept provides a method of manufacturing an integrated circuit device that may prevent elements disposed around a TSV structure from being damaged or deteriorating due to a process atmosphere while the TSV structure is formed.

According to an aspect of the inventive concept, there is provided an integrated circuit device including: a semiconductor structure including a substrate and an interlayer insulating film; a through-silicon-via (TSV) structure passing through the substrate and the interlayer insulating film; a via insulating film passing through the substrate and the interlayer insulating film and substantially surrounds the TSV structure; and an insulating spacer disposed between the interlayer insulating film and the via insulating film.

The interlayer insulating film may have a multi-layer structure in which a plurality of insulating films formed of different materials are stacked, and the insulating spacer may contact each of the plurality of insulating films.

According to another aspect of the present invention, there is provided an integrated circuit device including: a semiconductor structure including a semiconductor substrate and an interlayer insulating film; a through-silicon-via (TSV) structure formed in a via hole passing through the semiconductor substrate and the interlayer insulating film; a via insulating film disposed in the via hole and surrounding the TSV structure; and an insulating spacer provided on the semiconductor substrate to be disposed between the interlayer insulating film and the via insulating film, the insulating spacer substantially surrounding the TSV structure.

The interlayer insulating film may include a first insulating film and a second insulating film that have different dielectric constants and respectively define widths of the via hole, and a first horizontal width of a portion of the via hole defined by the first insulating film and a second horizontal width of a portion of the via hole defined by the second insulating film may be different from each other.

The interlayer insulating film may include a first insulating film having a first dielectric constant, and a second insulating film having a second dielectric constant higher than the first dielectric constant, and the via hole may include a first hole portion defined by the first insulating film and a second hole portion defined by the second insulating film, and the second hole portion has a width greater than a width of the first hole portion.

The interlayer insulating film may have a multi-layer structure in which a first insulating film having a first dielectric constant and a second insulating film having a second dielectric constant that is higher than the first dielectric constant are alternately stacked a plurality of times, and the via hole may include a first via hole defined by the multi-layer structure and having an inner wall having an uneven shape, and a second via hole being communicated with the first via hole and being defined by the semiconductor substrate.

The interlayer insulating film may include a first insulating film and a second insulating film that are formed of different materials and respectively define widths of the via hole, the insulating spacer may include a first outer wall portion being in contact with the first insulating film, and a second outer wall portion being in contact with the second insulating film, and horizontal distances of the first outer wall portion and the second outer wall portion from the TSV structure may be different from each other.

The interlayer insulating film may include a first insulating film having a first dielectric constant, and a second insulating film having a second dielectric constant higher than the first dielectric constant, the insulating spacer may include a first outer wall portion being in contact with the first insulating film, and a second outer wall portion being in contact with the second insulating film, and the second outer wall portion may horizontally protrude outward farther away from the TSV structure than the first outer wall portion.

The interlayer insulating film may have a multi-layer structure in which a first insulating film and a second insulating film formed of different materials are alternately stacked a plurality of times, and the insulating spacer may have an outer wall having an uneven shape, the outer wall being in contact with the multi-layer structure.

The insulating spacer may extend to cover at least a part of a vertical length extending from a top surface of the semiconductor substrate to an entrance of the via hole near a top surface of the interlayer insulating film.

The insulating spacer may extend from a top surface of the semiconductor substrate to an entrance of the via hole along a surface of the interlayer insulating film facing an inside of the via hole.

The insulating spacer may extend from a top surface of the semiconductor substrate to a level lower than an entrance of the via hole along a surface of the interlayer insulating film facing an inside of the via hole.

The via hole may include a first via hole passing through the interlayer insulating film, and a second via hole passing through the semiconductor substrate and being in communication with the first via hole, and a first width of a portion of the first via hole closest to the semiconductor substrate and a second width of a portion of the second via hole closest to the interlayer insulating film may be different from each other. The second width may be smaller than the first width.

According to another aspect of the present invention, there is provided a method of manufacturing an integrated circuit device, the method including: forming an interlayer insulating film on a substrate; forming a first via hole by etching a portion of the interlayer insulating film; forming an insulating spacer covering the interlayer insulating film in the first via hole; forming a second via hole that communicates with the first via hole by etching the substrate by using the insulating spacer as an etch mask; forming a via insulating film covering the insulating spacer and the substrate in the first via hole and the second via hole; and forming a through-silicon-via (TSV) structure that is substantially surrounded by the via insulating film in the first via hole and the second via hole.

The forming of the first via hole may include: forming a mask pattern on the interlayer insulating film; etching a portion of the interlayer insulating film by using the mask pattern as an etch mask; and removing the mask pattern by using an organic strip solution.

After the forming of the second via hole and before the forming of the via insulating film, the method may further include performing wet cleaning on an inner wall of the second via hole.

The forming of the first via hole may include etching the interlayer insulating film until the substrate is exposed.

The forming of the first via hole may include exposing a top surface of the substrate through a bottom surface of the first via hole by etching a portion of the interlayer insulating film to a predetermined thickness.

The forming of the insulating spacer may include: forming a spacer layer covering a top surface of the interlayer insulating film and an inner wall of the first via hole; and exposing a bottom surface of the first via hole by removing a portion of the spacer layer. The insulating spacer may be formed by using a material that is different from a material of the interlayer insulating film.

According to another aspect of the present invention, there is provided a method of manufacturing an integrated circuit device, the method including: preparing a semiconductor structure including a semiconductor substrate and an interlayer insulating film; forming a first via hole passing through at least a part of the interlayer insulating film; forming an insulating spacer covering the interlayer insulating film exposed through an inner side wall of the first via hole; forming a second via hole having a width smaller than a width of the first via hole and communicating with the first via hole by etching the semiconductor substrate by using the first insulating spacer as an etch mask; forming a via insulating film defining a through-silicon-via (TSV) space in the first via hole and the second via hole and passing through the semiconductor substrate and the interlayer insulating film; and forming a TSV structure in the TSV space.

The interlayer insulating film may have a multi-layer structure in which a first insulating film and a second insulating film formed of different materials are alternately stacked a plurality of times, wherein the first via hole is formed to pass through the multi-layer structure, and the first via hole may be formed such that a first portion of the first via hole which passes through the first insulating film and a second portion of the first via hole which passes through the second insulating film have different widths. The insulating spacer may be formed to have an outer wall having an uneven shape, the outer wall being in contact with the multi-layer structure.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
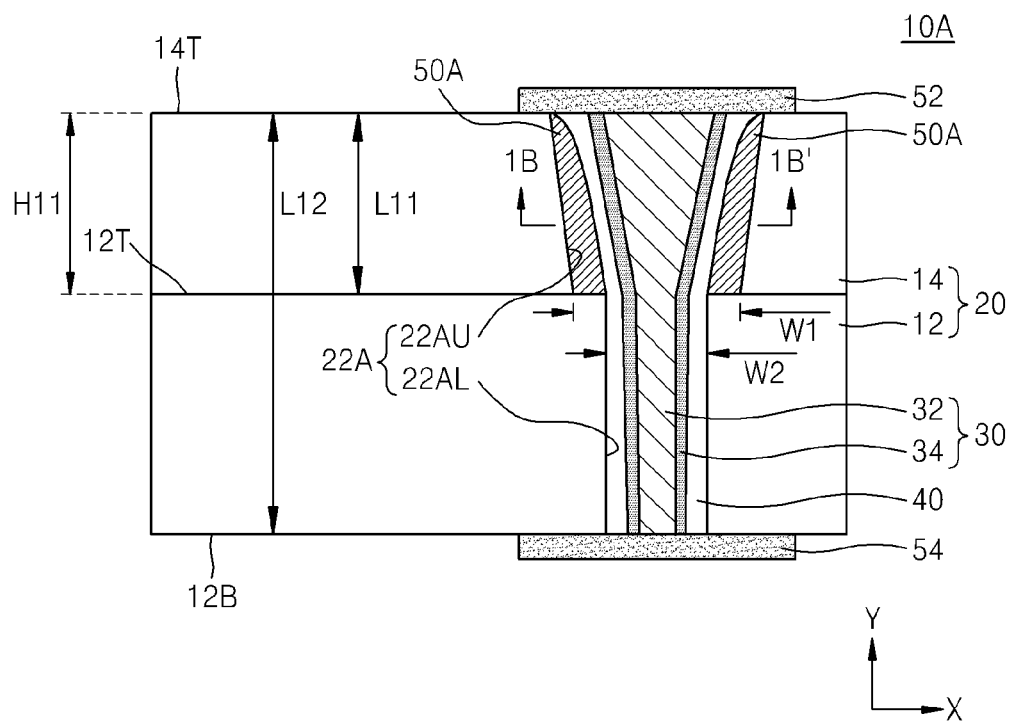
FIG. 1A is a cross-sectional view illustrating an integrated circuit device according to an embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully with reference to the accompanying drawings, in which exemplary embodiments of the inventive concept are shown. In the drawings, the same elements are denoted by the same reference numerals and a repeated explanation thereof will not be given.

Hereinafter, the inventive concept will be described more fully with reference to the accompanying drawings, in which exemplary embodiments of the inventive concept are shown. The inventive concept may, however, be embodied in many different forms and should not be construed as being limited to the embodiments set forth herein; rather these embodiments are provided so that this disclosure will be thorough and complete, and will fully convey the concept of the inventive concept to one of ordinary skill in the art.

It will be understood that, although the terms first, second, third etc. may be used herein to describe various members, components, regions, layers, portions, and/or elements, these members, regions, layers, portions, and/or elements should not be limited by these terms. These terms are only used to distinguish one member, region, layer, portion, or element from another member, region, layer, portion, or element. Thus, a first member, region, layer, portion, or element discussed below could be termed a second member, region, layer, portion, or element without departing from the teachings of exemplary embodiments. For example, a first element may be referred to as a second element, and likewise, a second element may be referred to as a first element without departing from the scope of the inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A specific process order may be changed in another embodiment. For example, two processes which are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

FIG. 1A is a cross-sectional view illustrating an integrated circuit device 10A according to an embodiment of the inventive concept.

Referring to FIG. 1A, the integrated circuit device 10A includes a semiconductor structure 20 that includes a substrate 12 and an insulating film (e.g., an interlayer insulating film) 14, a through-silicon-via (TSV) structure 30 formed in a via hole 22A that passes through the substrate 12 and the insulating film 14, and a via insulating film 40 in the via hole 22A that substantially surrounds the TSV structure 30.

The substrate 12 may be a semiconductor substrate, for example, a silicon substrate. The insulating film 14 may be an interlayer insulating film, an inter-metal dielectric film, or a combination thereof.

The via hole 22A includes a first via hole 22AU that passes through the insulating film 14, and a second via hole 22AL that passes through the substrate 12. The first via hole 22AU and the second via hole 22AL communicate with each other. An insulating spacer 50A can be located only in the first via hole 22AU.

A first width W1 of a portion of the first via hole 22AU closest to the substrate 12 and a second width W2 of a portion of the second via hole 22AL closest to the insulating film 14 may be different from each other. In some embodiments, a difference between the first width W1 and the second width W2 may be determined by a horizontal width of the insulating spacer 50A. In an embodiment, the second width W2 may be less than the first width W1.

The insulating spacer 50A may be provided on the substrate 12 between the insulating film 14 and the via insulating film 40. The insulating spacer 50A substantially surrounds a part of the TSV structure 30. The insulating spacer 50A may have substantially the same height (or vertical length) L11 as a height measured from a top surface 12T of the substrate 12 to a top surface 14T of the insulating film 14. That is, a height L11 of the insulating spacer 50A may correspond to a vertical length H11 from the top surface 12T of the substrate 12 to an entrance of the first via hole 22AU adjacent to the top surface 14T of the insulating film 14. The vertical length H11 may correspond to a thickness of the insulating film 14, and the height L11 of the insulating spacer 50A may therefore be the same as a thickness of the insulating film 14. In some embodiments, the insulating spacer 50A may be shorter than the vertical length H11 so as to cover only a part of a surface of the insulating film 14 facing an inside of the first via hole 22AU.

In FIG. 1A, the insulating spacer 50A is arranged along a surface of the insulating film 14 facing an inside of the via hole 22A and extends from the top surface 12T of the substrate 12 to the entrance of the first via hole 22AU adjacent to the top surface 14T of the insulating film 14 to have a height L11 substantially corresponding to the vertical length H11. However, the present embodiment is not limited thereto. The insulating spacer 50A may have a height L21, L31 less than the vertical length H21, H31 (see FIGS. 2 and 3).

The via insulating film 40 extends through substantially the entire longitudinal length of the via hole 22A. Although the via insulating film 40 extends from the top surface 14T of the insulating film 14 to a back surface 12B of the substrate 12 in FIG. 1A, the present embodiment is not limited thereto.

A first vertical length L11 of the insulating spacer 50A in a longitudinal direction (Y direction in FIG. 1A) of the via hole 22A is less than a second vertical length L12 of the via insulating film 40. As described above, the first vertical length L11 of the insulating spacer 50A may be substantially the same as the vertical length H11 corresponding to a thickness of the insulating film 14. The insulating spacer 50A may contact the substrate 12. The longitudinal direction of the via hole 22A may mean the direction extending from the back surface 12B of the substrate 12 to the top surface 14T of the insulating film 14 of the semiconductor structure 20. The longitudinal direction of the via hole 22A and a longitudinal direction of the TSV structure 30 may be the same.

The TSV structure 30 includes a conductive plug 32, and a conductive bather film 34 that substantially surrounds the conductive plug 32.

The conductive plug 32 may include a first metal, and the conductive barrier film 34 may include a metal different from the first metal. In an embodiment, the conductive plug 32 may include copper (Cu) or tungsten (W). For example, the conductive plug 32 may be formed of, but is not limited to, Cu, CuSn, CuMg, CuNi, CuZn, CuPd, CuAu, CuRe, CuW, W, or a W alloy.

The conductive bather film 34 contacts a side wall of the conductive plug 32 and substantially surrounds the conductive plug 32. The conductive bather film 34 may be a conductive layer having a relatively low wiring resistance. For example, the conductive barrier film 34 may be a single film or a multi-layer film including at least one selected from W, WN, titanium (Ti), TiN, tantalum (Ta), TaN, and ruthenium (Ru). For example, the conductive bather film 34 may be a multi-layer film formed of TaN/W, TiN/W, or WN/W. The conductive bather film 34 may have a thickness ranging from about 500 Å to about 1000 Å.

In an embodiment, the conductive barrier film 34 may have a substantially uniform thickness in the longitudinal direction of the TSV structure 30. In an embodiment, the conductive barrier film 34 may be formed by using physical vapor deposition (PVD) or chemical vapor deposition (CVD). Alternatively, the conductive barrier film 34 may be formed by using atomic layer deposition (ALD).

Alternatively, the conductive barrier film 34 may have a thickness that decreases from the top surface 14T of the insulating film 14 toward the back surface 12B of the substrate 12 of the semiconductor structure 20. For example, the conductive barrier film 34 may have a thickness ranging from about 100 Å to about 1000 Å near to the top surface 14T of the insulating film 14 in the via hole 22A, and may have a thickness ranging from about 0 Å to about 50 Å near the back surface 12B of the substrate 12 in the via hole 22A. PVD may be used to form the conductive barrier film 34 having a thickness that varies in the longitudinal direction of the via hole 22A.

The via insulating film 40 separates the semiconductor structure 20 from the TSV structure 30. The via insulating film 40 may be include an oxide film, a nitride film, a carbide film, a polymer, or a combination thereof. In an embodiment, to form the via insulating film 40, CVD may be used. The via insulating film 40 may be formed to have a thickness ranging from about 500 Å to about 2500 Å.

The insulating spacer 50A may include a silicon oxide film, a silicon nitride film, a silicon oxynitride film, an insulating metal oxide film, a high-k film, a polymer film, or a combination thereof. In some embodiments, the insulating spacer 50A may include a high-k film having a dielectric constant higher than that of a silicon oxide film. For example, the insulating spacer 50A may have a dielectric constant ranging from about 10 to about 25. In an embodiment, the insulating spacer 50A may be formed of at least one material selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). In an embodiment, the insulating spacer 50A may have a thickness ranging from about 100 Å to about 3000 Å.

Conductive layers 52 and 54 that are connected to the TSV structure 30 are respectively formed on the top surface 14T of the insulating film 14 and the back surface 12B of the substrate 12 of the semiconductor structure 20.

Figure 1B:
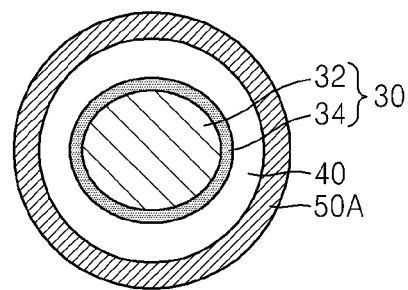
FIG. 1B is a cross-sectional view taken along line 1B-1B' of FIG. 1A.

FIG. 1B is a cross-sectional view taken along line 1B-1B' of FIG. 1A.

Referring to FIG. 1B, the TSV structure 30 may be substantially surrounded by the via insulating film 40 having a ring-shaped structure in cross-section, and the via insulating film 40 is surrounded by the insulating spacer 50A having a ring-shaped structure in cross-section.

Although each of the TSV structure 30, the via insulating film 40, and the insulating spacer 50A has a substantially circular cross-sectional shape in FIG. 1B, the present embodiment is not limited thereto. For example, each of the TSV structure 30, the via insulating film 40, and the insulating spacer 50A may have any of various cross-sectional shape such as a polygonal shape or an oval shape.

Figure 2:
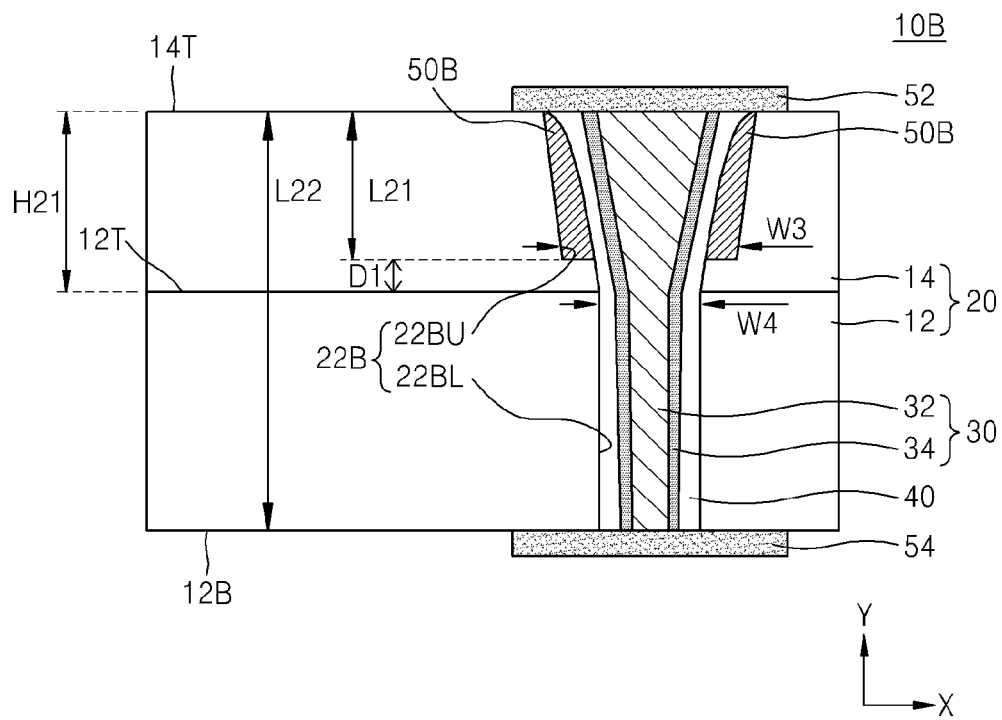
FIG. 2 is a cross-sectional view illustrating an integrated circuit device according to another embodiment of the inventive concept.

FIG. 2 is a cross-sectional view illustrating an integrated circuit device 10B according to another embodiment of the inventive concept. In FIG. 2, the same elements as those in FIG. 1A are denoted by the same reference numerals, and a detailed explanation thereof will not be given.

Referring to FIG. 2, in the integrated circuit device 10B, a via hole 22B that passes through the substrate 12 and the insulating film 14 includes a first via hole 22BU that is defined by the insulating film 14, and a second via hole 22BL that extends from the insulating film 14 through the substrate 12 to the back surface 12B of the substrate 12 to communicate with the first via hole 22BU.

At a point where the first via hole 22BU and the second via hole 22BL meet each other, a third width W3 of the first via hole 22BU is greater than a fourth width W4 of the second via hole 22BL. In some embodiments, a difference between the third width W3 and the fourth width W4 may be determined by a width of an insulating spacer 50B.

The insulating spacer 50B may have a height (or vertical length) L21 that is less than a length H21 from the top surface 12T of the substrate 12 to the top surface 14T of the insulating film 14. That is, the insulating spacer 50B may have a height L21 that is less than a vertical length H21, measured from the top surface 12T of the substrate 12 to the top surface 14T of the insulating film 14. The insulating spacer 50B may have a height that ranges between a height L11 corresponding to the vertical length H11 to a height L21 that covers all but a length D1 of a surface of the insulating film 14 facing an inside of the first via hole 22BU.

In a longitudinal direction (Y direction in FIG. 2) of the via hole 22B, a first vertical length L21 of the first insulating spacer 50B is less than a second vertical length L22 of the via insulating film 40. Also, the first vertical length L21 of the insulating spacer 50B is less than the vertical length H21, measured from the top surface 12T of the substrate 12 to the entrance of the first via hole 22BU, which is adjacent to the top surface 14T of the insulating film 14. The insulating spacer 50B is spaced apart from the substrate 12 by a predetermined distance D1.

The explanation of the insulating spacer 50A made with reference to FIGS. 1A and 1B may apply to the insulating spacer 50B.

Figure 3:
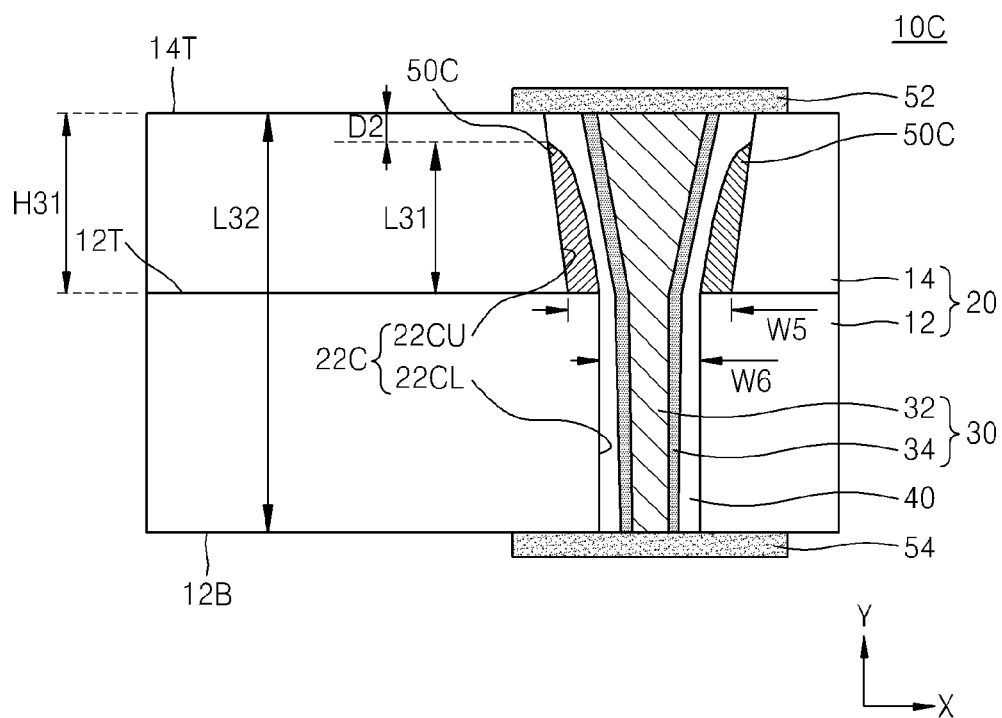
FIG. 3 is a cross-sectional view illustrating an integrated circuit device according to another embodiment of the inventive concept.

FIG. 3 is a cross-sectional view illustrating an integrated circuit device 10C according to another embodiment of the inventive concept. In FIG. 3, the same elements as those in FIG. 1A are denoted by the same reference numerals, and a detailed explanation thereof will not be given.

Referring to FIG. 3, in the integrated circuit device 10C, a via hole 22C that passes through the substrate 12 and the insulating film 14 includes a first via hole 22CU that passes through the insulating film 14, and a second via hole 22CL that passes through the substrate 12. The first via hole 22CU and the second via hole 22CL communicate with each other.

A fifth width W5 of a portion of the first via hole 22CU closest to the substrate 12 and a sixth width W6 of a portion of the second via hole 22CL closest to the insulating film 14 may be different from each other. In an embodiment, a difference between the fifth width W5 and the sixth width W6 may be determined by a width of an insulating spacer 50C. The sixth width W6 may be less than the fifth width W5.

The insulating spacer 50C may therefore be formed having a height that ranges from a height that corresponds to a vertical length H31 of the insulating film 14 to a height that covers all but an upper length D2 of a surface of the insulating film 14 facing an inside of the first via hole 22CU.

In a longitudinal direction (Y direction in FIG. 3) of the via hole 22C, a first vertical length L31 of the insulating spacer 50C is less than a second vertical length L32 of the via insulating film 40. Also, the first vertical length L31 of the insulating spacer 50C is less than the vertical length H31 from the top surface 12T of the substrate 12 to the entrance of the via hole 22C, which is adjacent to the top surface 14T of the insulating film 14. A lower end portion of the insulating spacer 50C contacts the top surface 12T of the substrate 12, and an upper end portion of the insulating spacer 50C is spaced apart from the entrance of the via hole 22C by a predetermined distance D2.

The explanation of the insulating spacer 50A made with reference to FIGS. 1A and 1B may apply to the insulating spacer 50C.

Figure 4:
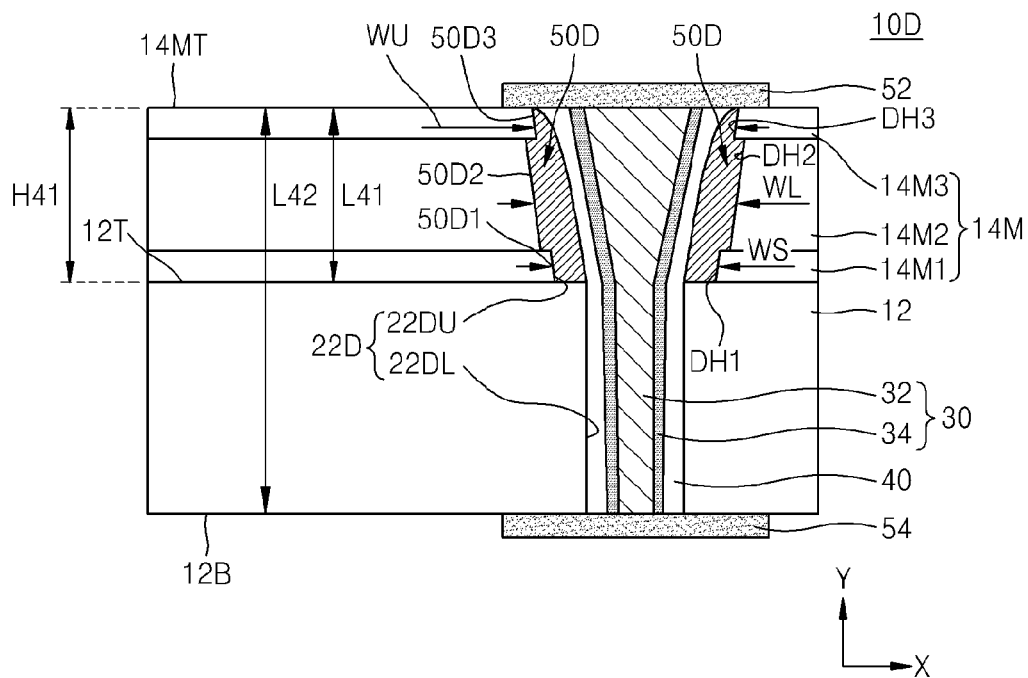
FIG. 4 is a cross-sectional view illustrating an integrated circuit device according to another embodiment of the inventive concept.

FIG. 4 is a cross-sectional view illustrating an integrated circuit device 10D according to another embodiment of the inventive concept. In FIG. 4, the same elements as those in FIG. 1A are denoted by the same reference numerals, and a detailed explanation thereof will not be given.

Referring to FIG. 4, in the integrated circuit device 10D, a via hole 22D that passes through the substrate 12 and an insulating film 14M includes a first via hole 22DU that passes through the insulating film 14M, and a second via hole 22DL that passes through the substrate 12. The first via hole 22DU and the second via hole 22DL communicate with each other. The first via hole 22DU has a width that varies according to a longitudinal direction thereof.

The insulating film 14M has a multi-layer structure in which a plurality of insulating films 14M1, 14M2, and 14M3 formed of different materials are sequentially stacked. In an embodiment, at least some of the plurality of insulating films 14M1, 14M2, and 14M3 may have different dielectric constants. In an embodiment, the insulating film 14M1 and the insulating film 14M2 may have different dielectric constants. Alternatively, the insulating film 14M2 and the insulating film 14M3 may have different dielectric constants. Alternatively, a dielectric constant of the insulating film 14M2 may be higher than dielectric constants of the insulating films 14M1 and 14M2 that are respectively formed under and over the insulating film 14M2.

The first via hole 22DU extends through the multi-layer structure in which the plurality of insulating films 14M1, 14M2, and 14M3 are sequentially stacked to the top surface 12T of the substrate 12.

An inner side wall of the first via hole 22DU may be covered by an insulating spacer 50D. The insulating spacer 50D may extend along a vertical length H41 of the insulating film 14M from the top surface 12T of the substrate 12 to an entrance of the via hole 22D, arranged near a top surface 14MT of the insulating film 14M, to cover at least parts of surfaces of the plurality of insulating films 14M1, 14M2, and 14M3 facing an inside of the first via hole 22DU. The insulating spacer 50D may therefore contact the plurality of insulating films 14M1, 14M2, and 14M3 in the first via hole 22DU.

In FIG. 4, the insulating spacer 50D extends from the top surface 12T of the substrate 12 along the surface of the insulating film 14M facing the inside of the first via hole 22DU to an entrance of the first via hole 22DU adjacent to the top surface 14MT of the insulating film 14M, therefore having a height that substantially corresponds to the vertical length H41. However, the present embodiment is not limited thereto. The insulating spacer 50D may have a height less than the vertical length H41.

In a longitudinal direction (Y direction in FIG. 4) of the via hole 22D, a first vertical length L41 of the insulating spacer 50D is less than a second vertical length L42 of the via insulating film 40. Also, the first vertical length L41 of the insulating spacer 50D may be substantially the same as the vertical length H41. A lower end portion of the insulating spacer 50D may contact the substrate 12.

In the via hole 22d, the plurality of insulating films 14M1, 14M2, and 14M3 may include at least two insulating films that define a width of the first via hole 22DU with different sizes. For example, a portion of the via hole 22D having a relatively small width WS may be defined by the insulating film 14M1, and a portion of the via hole 22D having a relatively large width WL may be defined by the insulating film 14M2. An upper portion of the via hole 22D may have a third width WU defined by the third insulating film 14M3.

In an embodiment, the insulating film 14M1 and the insulating film 14M3 may each have a first dielectric constant, and the insulating film 14M2 may have a second dielectric constant higher than the first dielectric constant. For example, the insulating film 14M1 and the insulating film 14M3 may be tetraethyl orthosilicate (TEOS) films, and the insulating film 14M2 may be an ultra low-k film having an ultra low dielectric constant ranging from about 2.2 to about 2.4, for example, a SiOC film or a SiCOH film. The via hole 50D may include a first hole portion DH1 defined by the insulating film 14M1, a second hole portion DH2 defined by the insulating film 14M2, and a third hole portion DH3 defined by the insulating film 14M3. In a horizontal direction (X direction in FIG. 4), the second hole portion DH2 may have a width WL greater than those WS, WU, respectively, of the first hole portion DH1 and the third hole portion DH3.

The insulating spacer 50D may include a first outer wall portion 50D1 that contacts the insulating film 14M1, a second outer wall portion 50D2 that contacts the insulating film 14M2, and a third outer wall portion 50D3 that contacts the insulating film 14M3. Horizontal distances (i.e., distances in the X direction of FIG. 4) from the first outer wall portion 50D1 to the TSV structure 30 and from the second outer wall portion 50D2 to the TSV structure 30, may be different from each other. Likewise, horizontal distances from the first outer wall portion 50D1 to the TSV structure 30 and from the third outer wall portion 50D3 to the TSV structure 30 may be different from each other.

Although the second outer wall portion 50D2 protrudes horizontally farther away from the TSV structure 30 than the first outer wall portion 50D1 and the second outer wall portion 50D3, the present embodiment is not limited thereto.

The explanation of the insulating spacer 50A made with reference to FIGS. 1A and 1B may apply to the insulating spacer 50D.

Figure 5:
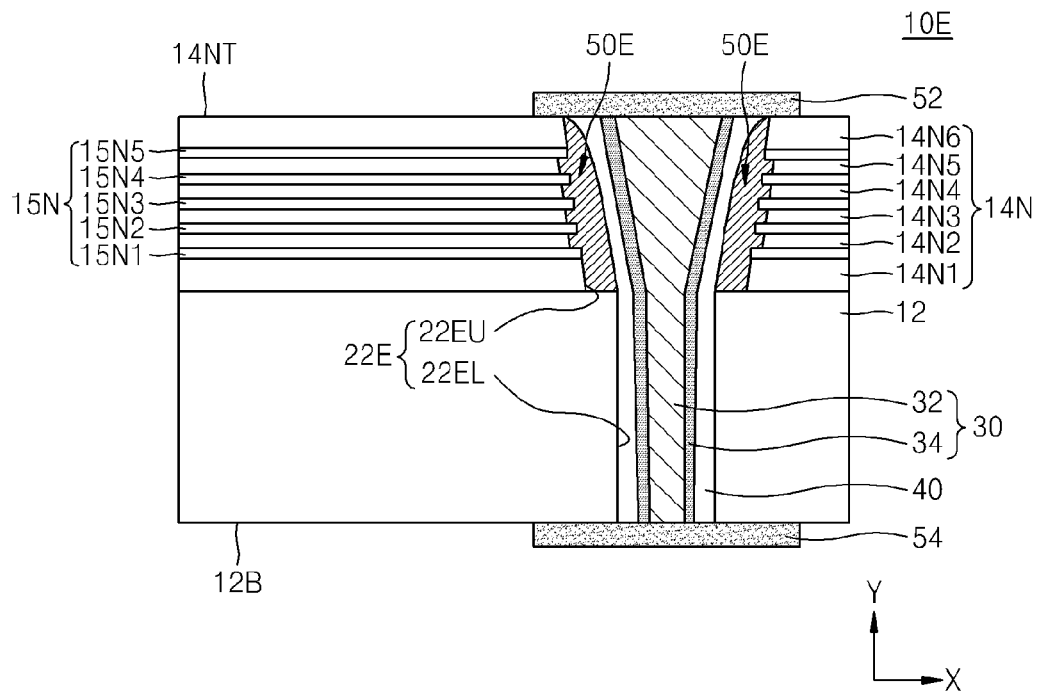
FIG. 5 is a cross-sectional view illustrating an integrated circuit device according to another embodiment of the inventive concept.

FIG. 5 is a cross-sectional view illustrating an integrated circuit device 10E according to another embodiment of the inventive concept. In FIG. 5, the same elements as those in FIGS. 1A and 4 are denoted by the same reference numerals, and a detailed explanation thereof will not be given.

The structure of the integrated circuit device 10E of FIG. 5 is similar in structure to that of the integrated circuit device 10D of FIG. 4. However, in the integrated circuit device 10E, an insulating film 14N has a multi-layer structure in which a plurality of insulating films 14N1, 14N2, 14N3, 14N4, 14N5, and 14N6 and a plurality of polish-stop layers 15N1, 15N2, 15N3, 15N4, and 15N5 are alternately stacked. In an embodiment, an insulating spacer 50E may contact the plurality of insulating films 14N1, 14N2, 14N3, 14N4, 14N5, and 14N6 and the plurality of polish-stop layers 15N1, 15N2, 15N3, 15N4, and 15N5.

In an embodiment, at least some of the plurality of insulating films 14N1, 14N2, 14N3, 14N4, 14N5, and 14N6 may be formed of different materials. Also, at least some of the plurality of insulating films 14N1, 14N2, 14N3, 14N4, 14N5, and 14N6 may have different dielectric constants. The insulating film 14N1 that is a lowermost layer and the insulating film 14N6 that is an uppermost layer from among the plurality of insulating films 14N1, 14N2, 14N3, 14N4, 14N5, and 14N6 may be formed of the same first material, and the insulating layers 14N2, 14N3, 14N4, and 14N5 that are intermediate layers may each be formed of a second material that is different from the first material. The second material may have a dielectric constant higher than that of the first material. For example, the insulating films 14N2, 14N3, 14N4, and 14N5 that are intermediate layers of the insulating film 14N may be ULK films, for example, SiOC films or SiCOH films. The insulating film 14N1 and the insulating film 14N6, that are respectively a lowermost layer and an uppermost layer, may be insulating films, for example, TEOS films, having dielectric constants lower than those of the intermediate layers.

A via hole 22E, in which the TSV structure 30 is formed, may include a first via hole 22EU that passes through the plurality of insulating films 14N1, 14N2, 14N3, 14N4, 14N5, and 14N6 and the plurality of polish-stop layers 15N1, 15N2, 15N3, 15N4, and 15N5, and a second via hole 22EL that passes through the substrate 12. The first via hole 22EU and the second via hole 22EL communicate with each other.

When the insulating film 14N is etched to form the first via hole 22EU, materials of the plurality of insulating films 14N1, 14N2, 14N3, 14N4, 14N5, and 14N6 may have different degrees of damage and removal rates in an etching atmosphere. For example, the insulating films 14N2, 14N3, 14N4, and 14N5 that are intermediate layers may be ULK films such as SiOC films or SiCOH films, and the insulating film 14N1 and the insulating film 14N6 that are respectively a lowermost layer and an uppermost layer may be TEOS films. In this case, ULK films formed of porous materials vulnerable to an etching atmosphere may be more damaged than TEOS films. Accordingly, damaged portions may be removed in a subsequent cleaning process. As a result, after an etching process and a subsequent cleaning process for forming the first via hole 22EU, the insulating films 14N2, 14N3, 14N4, and 14N5 that are intermediate layers and ULK films may be more removed than the insulating film 14N1 and the insulating film 14N6 that are respectively a lowermost layer and an uppermost layer and TEOS films. Thus, a portion of the first via hole 22EU horizontally defined by the insulating films 14N2, 14N3, 14N4, and 14N5 and the polish-stop layers 15N1, 15N2, 15N3, 15N4, and 15N5 adjacent thereto may have a width greater than a portion of the first via hole 22EU horizontally defined by the insulating film 14N1 and the insulating film 14N6. The first via hole 22EU having a cross-sectional profile as shown in FIG. 5 can thereby be obtained.

An inner side wall of the first via hole 22EU is covered by an insulating spacer 50E. The insulating spacer 50E includes a portion that contacts the multi-layer structure of the insulating film 14N. In particular, an outer wall portion of the insulating spacer 50E contacting the plurality of polish-stop layers 15N1, 15N2, 15N3, 15N4, and 15N5 and the insulating films 14N2, 14N3, 14N4, and 14N5 adjacent thereto may protrude farther away from the TSV structure 30 than another portion. Since the plurality of polish-stop layers 15N1, 15N2, 15N3, 15N4, and 15N5 have lower removal rates than the insulating films 14N2, 14N3, 14N4, and 14N5 adjacent thereto, the plurality of polish-stop layers 15N1, 15N2, 15N3, 15N4, and 15N5 may protrude into the first via hole 22EU from the insulating films 14N2, 14N3, 14N4, and 14N5 adjacent thereto. Accordingly, the first via hole 22EU may have an inner wall structure having an uneven, or toothed, shape.

The insulating spacer 50E may contact the inner wall having the uneven shape formed by the plurality of polish-stop layers 15N1, 15N2, 15N3, 15N4, and 15N5 and the insulating films 14N2, 14N3, 14N4, and 14N5 adjacent thereto, and may have an outer wall having an uneven, or toothed, shape corresponding to the inner wall having the uneven shape of the first via hole 22EU.

The explanation of the insulating spacer 50A made with reference to FIGS. 1A and 1B may apply to the insulating spacer 50E.

Figure 6:
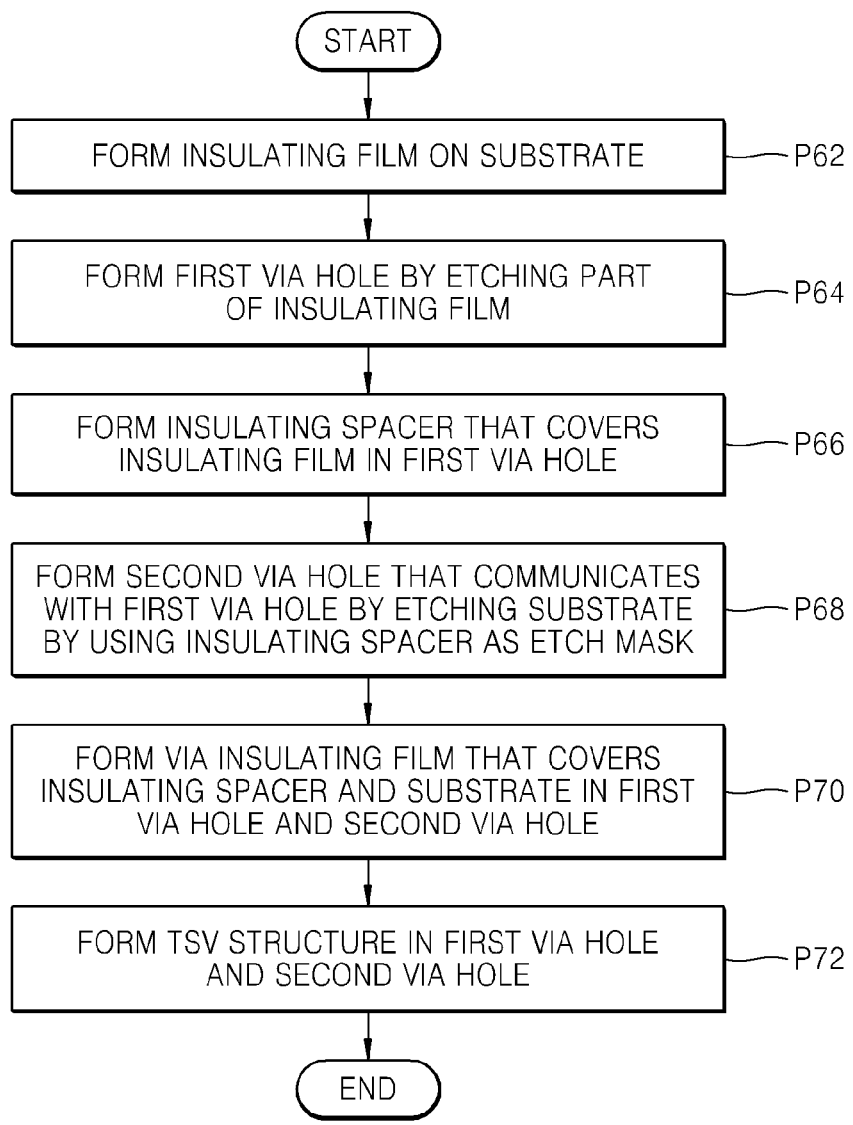
FIG. 6 is a flowchart illustrating a method of manufacturing an integrated circuit device, according to an embodiment of the inventive concept.

FIG. 6 is a flowchart illustrating a method of manufacturing an integrated circuit device, according to an embodiment of the inventive concept. A repeated explanation of the same elements as those in FIG. 1A will be omitted.

Referring to FIGS. 1A and 6, in operation P62, the insulating film 14 may be formed on the substrate 12.

In operation P64, the first via hole 22AU may be formed by etching a part of the insulating film 14.

In operation P66, the insulating spacer 50A that covers the insulating film 14 may be formed in the first via hole 22AU.

In operation P68, the second via hole 22AL that communicates with the first via hole 22AU may be formed by etching the substrate 12 by using the insulating spacer 50A as an etch mask.

In operation P70, the via insulating film 40 that covers the insulating spacer 50A and the substrate 12 may be formed in the first via hole 22AU and the second via hole 22AL.

In operation P72, the TSV structure 30 substantially surrounded by the via insulating film 40 may be formed in the first via hole 22AU and the second via hole 22AL.

Although the integrated circuit device 10A is manufactured by using the method of FIG. 6, the present embodiment is not limited thereto. The method of FIG. 6 may be applied to a process of manufacturing each of the integrated circuit devices 10B, 10C, 10D, and 10E of FIGS. 2 through 5.

Figure 7:
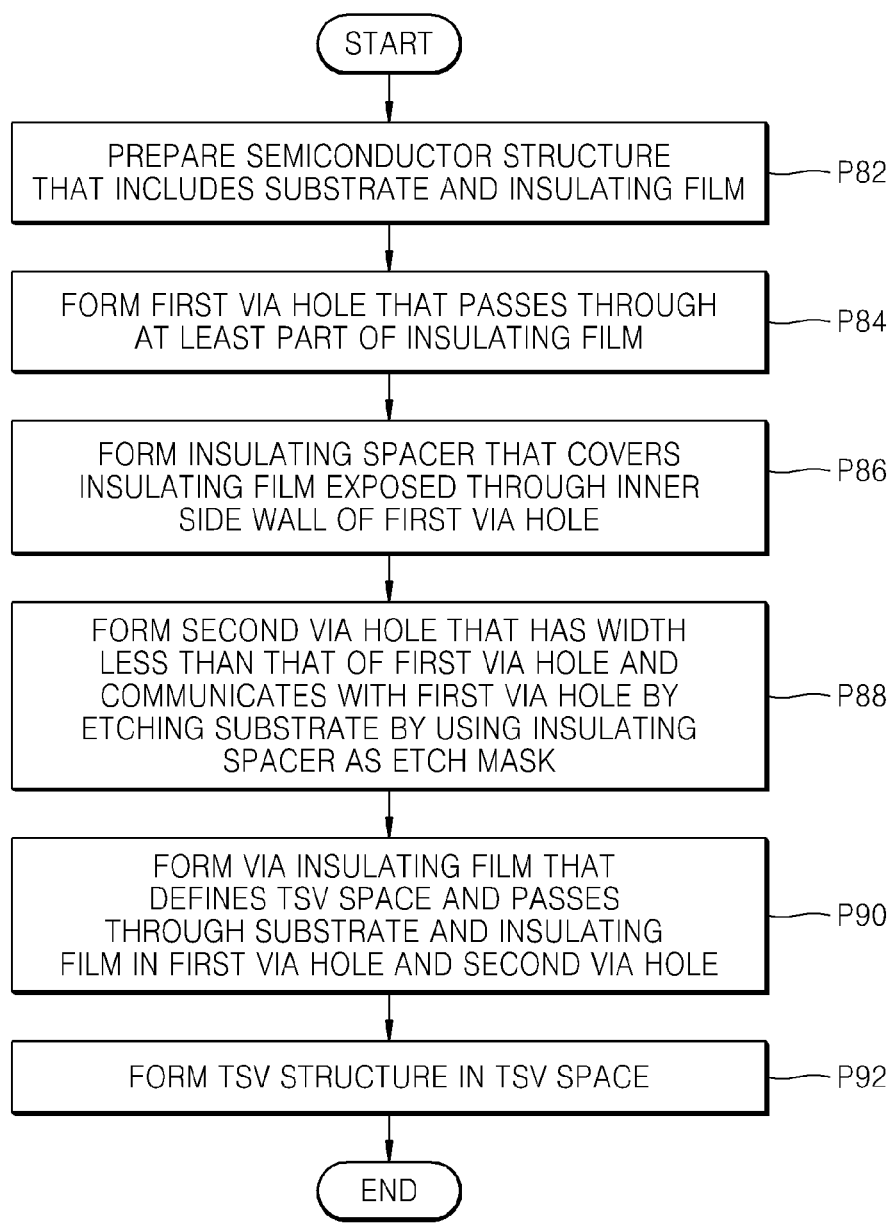
FIG. 7 is a flowchart illustrating a method of manufacturing an integrated circuit device, according to another embodiment of the inventive concept.

FIG. 7 is a flowchart illustrating a method of manufacturing an integrated circuit device, according to another embodiment of the inventive concept. A repeated explanation of the same elements as those in FIGS. 1A through 5 will be omitted.

Referring to FIGS. 1A through 5, and 7, in operation P82, the semiconductor structure 20 including the substrate 12 and the insulating film 14, 14M or 14N may be prepared.

In operation P84, the first via hole 22AU, 22BU, 22CU, 22DU, or 22EU that passes through at least a part of the insulating film 14, 14M, or 14N may be formed.

In operation P86, the insulating spacer 50A, 50B, 50C, 50D, or 50E that covers sidewalls of the insulating film 14, 14M, or 14N exposed through the first via hole 22AU, 22BU, 22CU, 22DU, or 22EU is formed.

In operation P88, the second via hole 22AL, 22BL, 22CL, 22DL, or 22EL that has a width less than that of the first via hole 22AU, 22BU, 22CU, 22DU, or 22EU and communicates with the first via hole 22AU, 22BU, 22CU, 22DU, or 22EU is formed by etching the substrate 12 by using the insulating spacer 50A, 50B, 50C, 50D, or 50E as an etch mask.

In operation P90, the via insulating film 40 that defines a TSV space in which the TSV structure 30 is to be formed and passes through the substrate 12 and the insulating film 14, 14M, or 14N is formed in the first via hole 22AU, 22BU, 22CU, 22DU, or 22EU and the second via hole 22AL, 22CL, 22CL, 22DL, or 22EL.

In operation P92, the TSV structure 30 is formed in the TSV space defined by the via insulating film 40.

A method of manufacturing an integrated circuit device according to an embodiment of the inventive concept will now be explained in more detail.

Figure 8A:
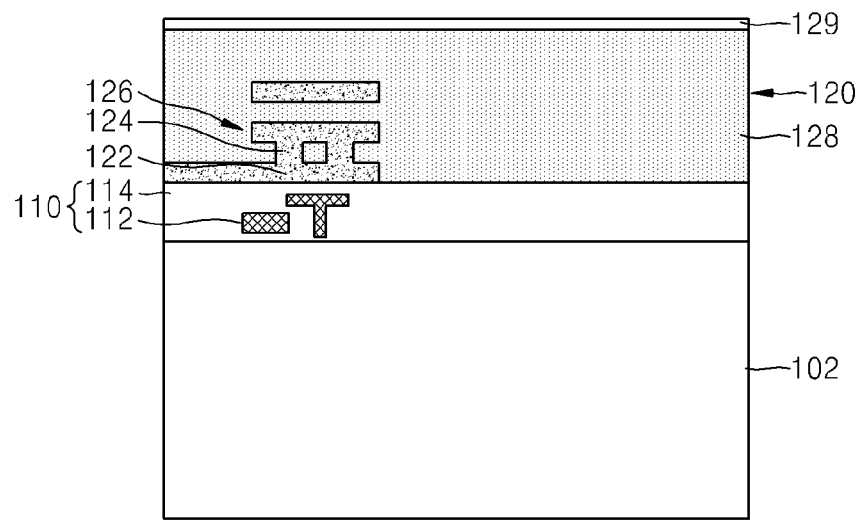
FIGS. 8A through 8O are cross-sectional view for explaining a method of manufacturing an integrated circuit device according to a process order, according to an embodiment of the inventive concept.
Figure 8B:
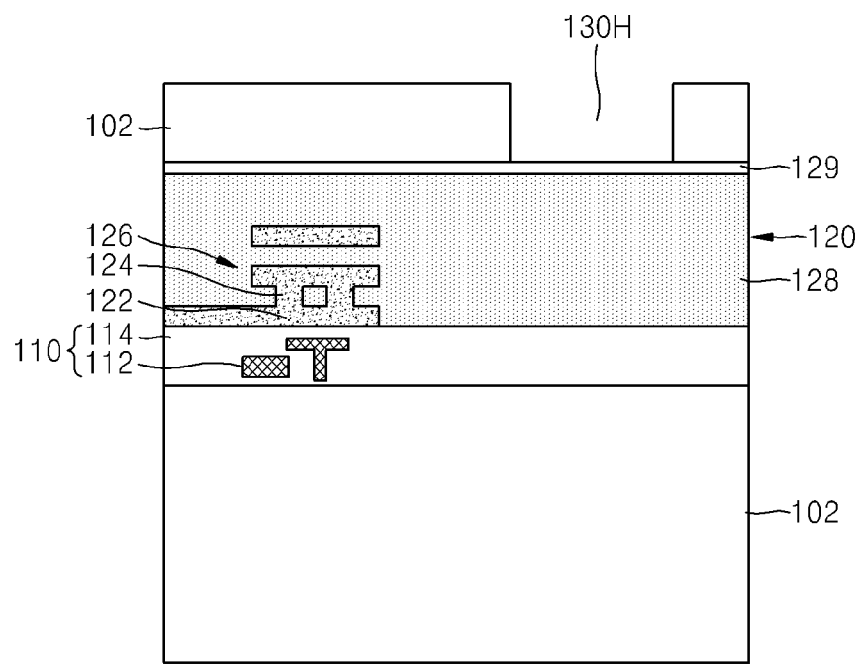
Figure 8C:
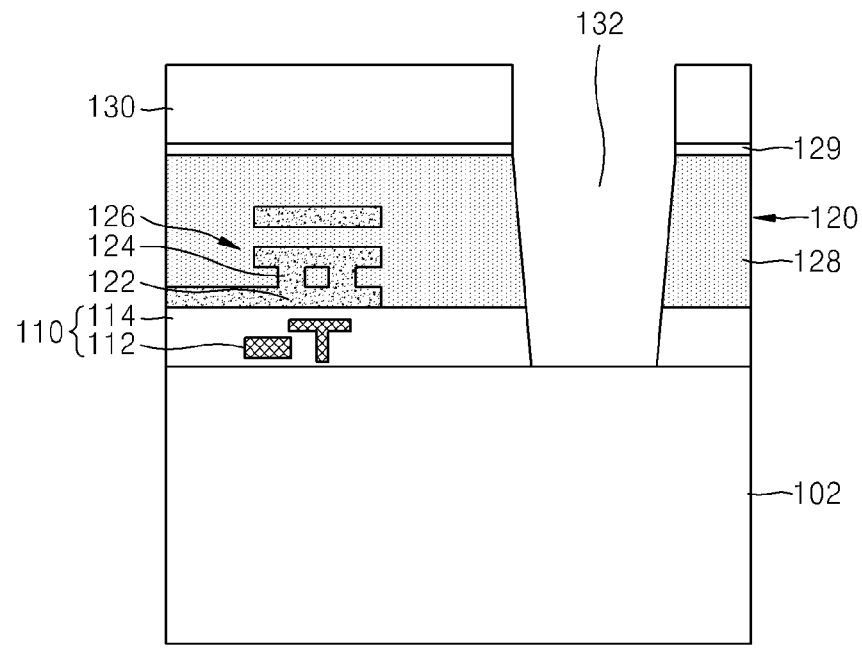
Figure 8D:
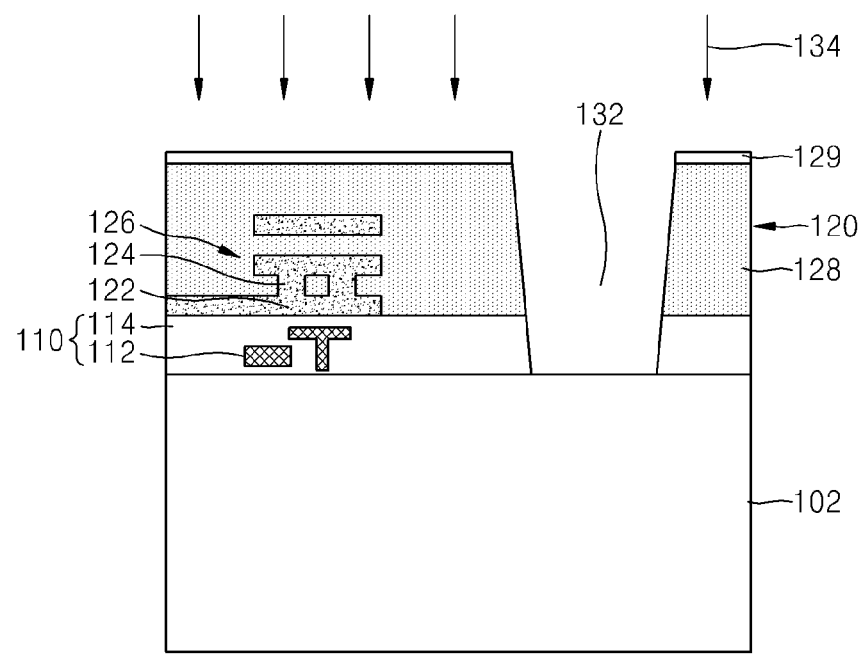
Figure 8E:
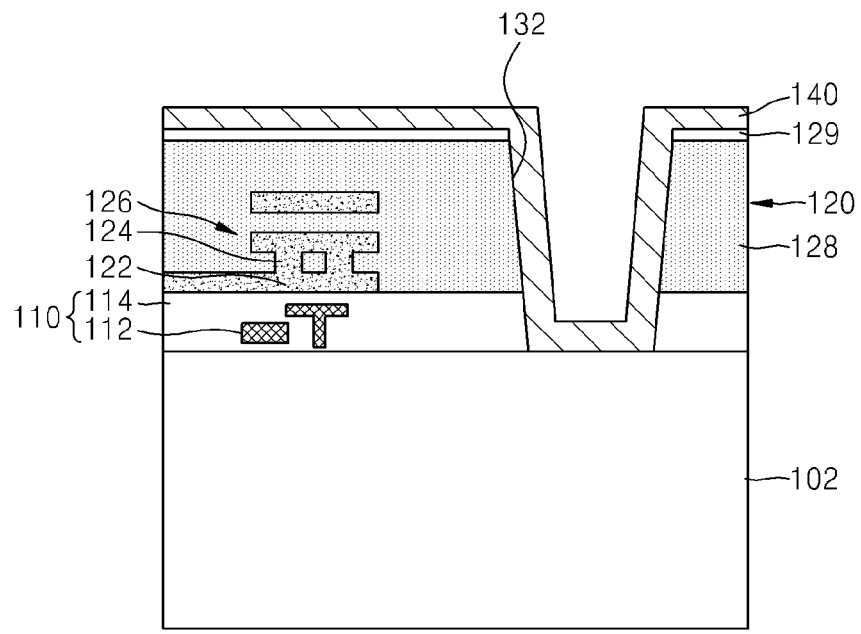
Figure 8F:
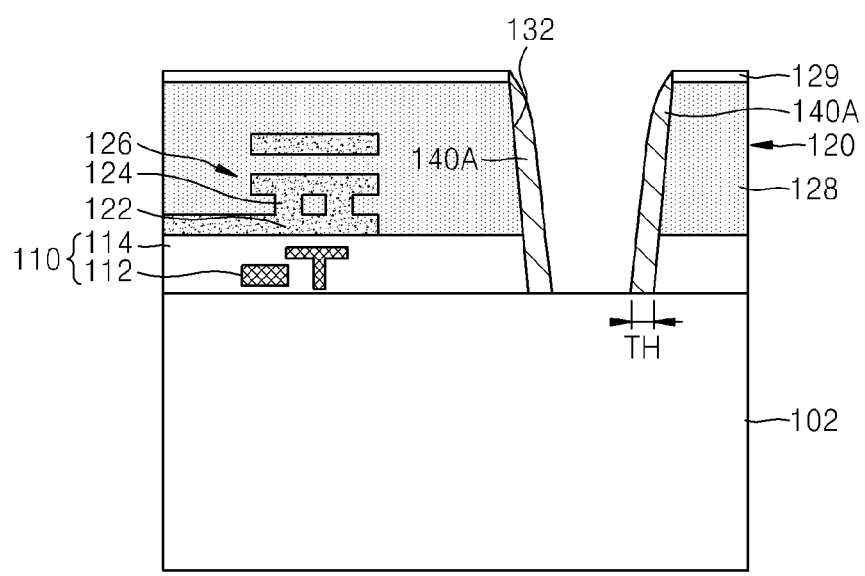
Figure 8G:
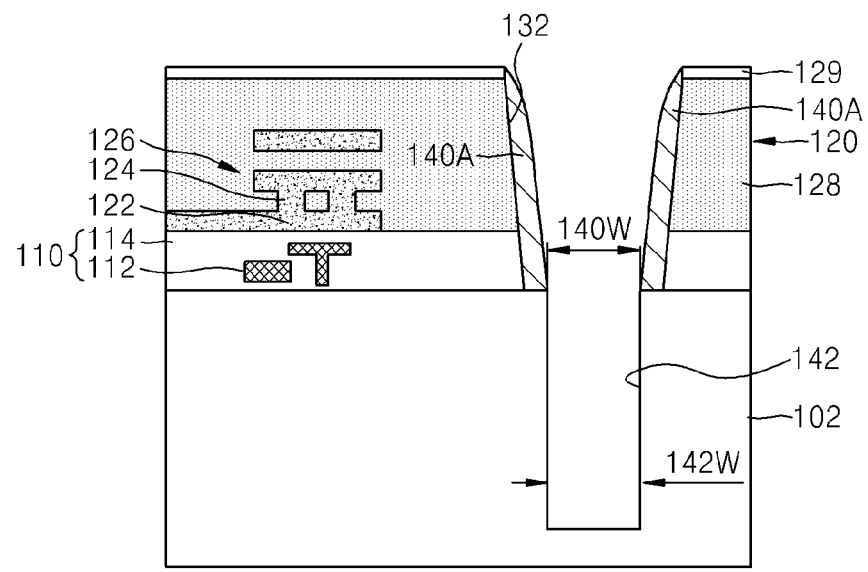
Figure 8H:
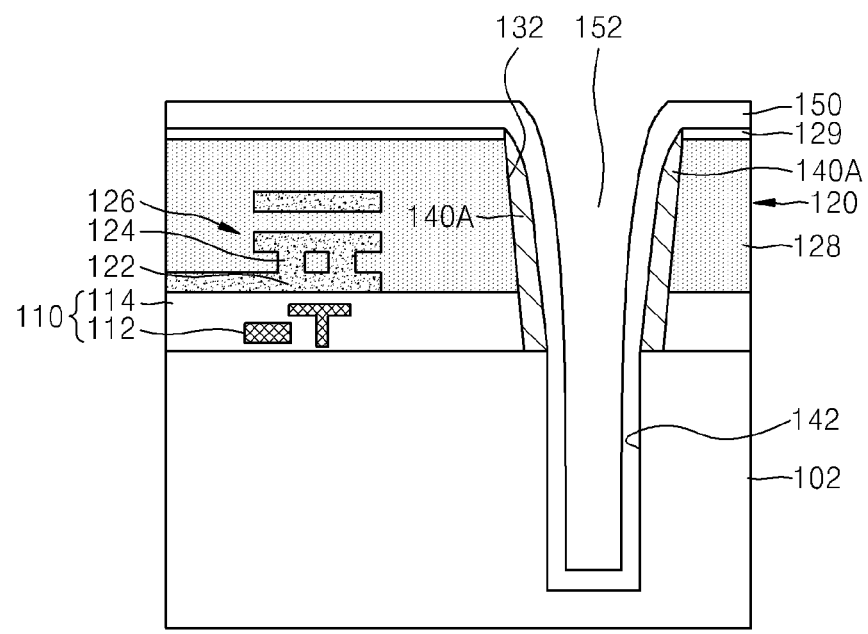
Figure 8I:
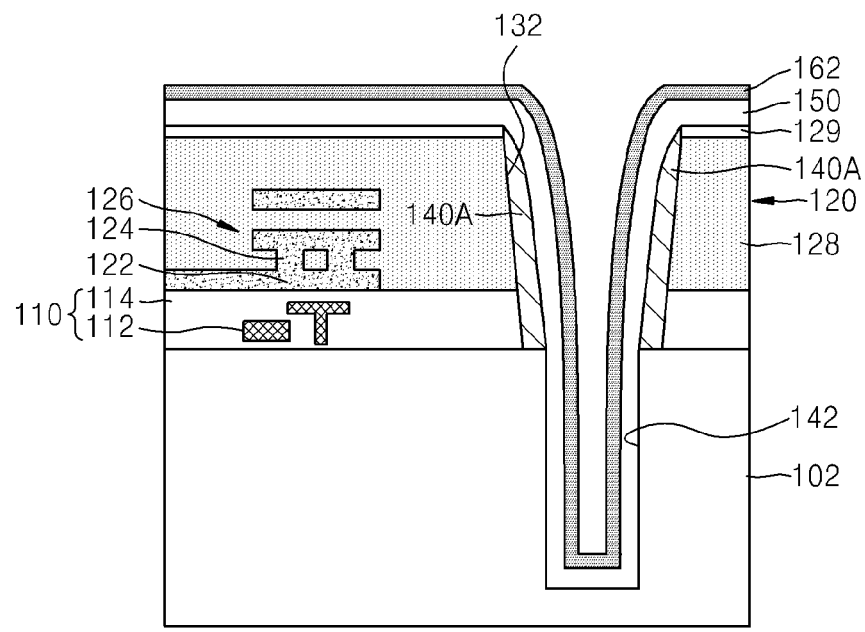
Figure 8J:
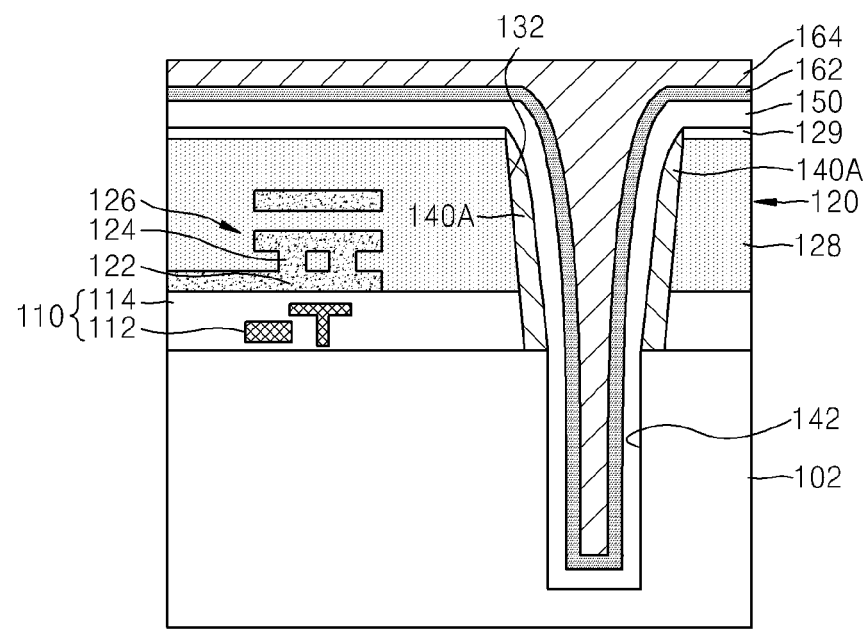
Figure 8K:
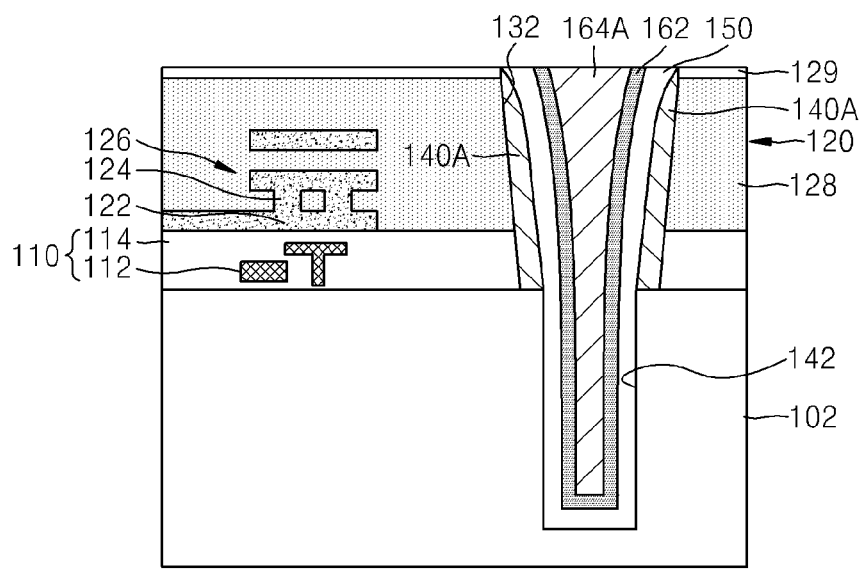
Figure 8L:
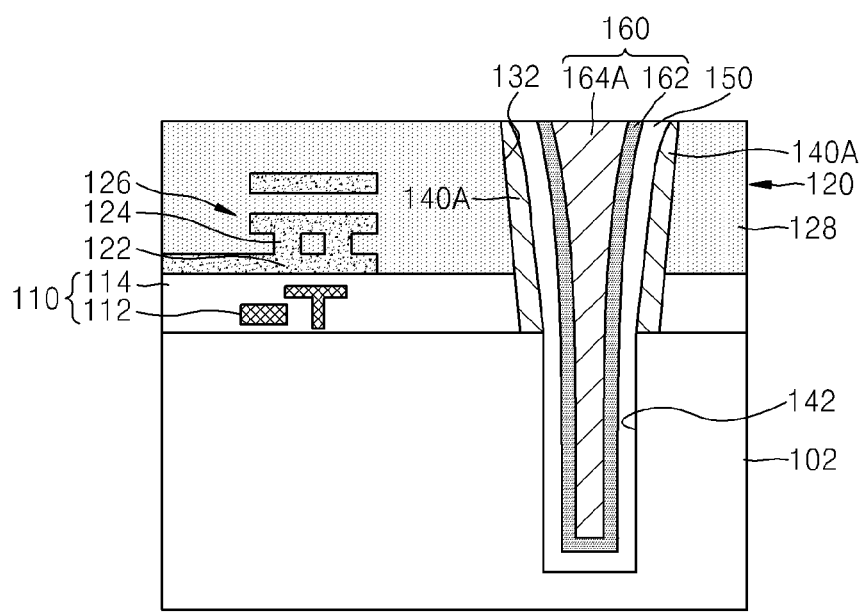
Figure 8M:
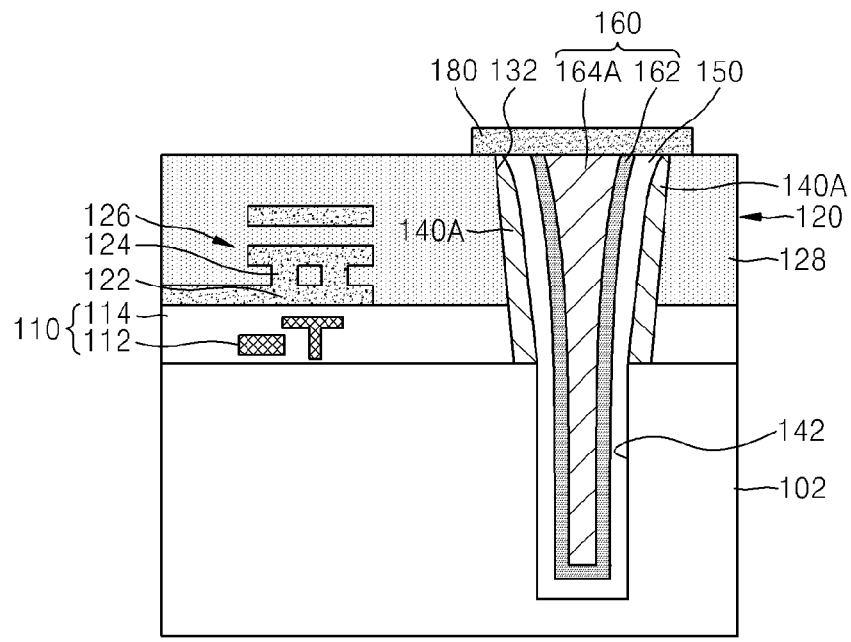
Figure 8N:
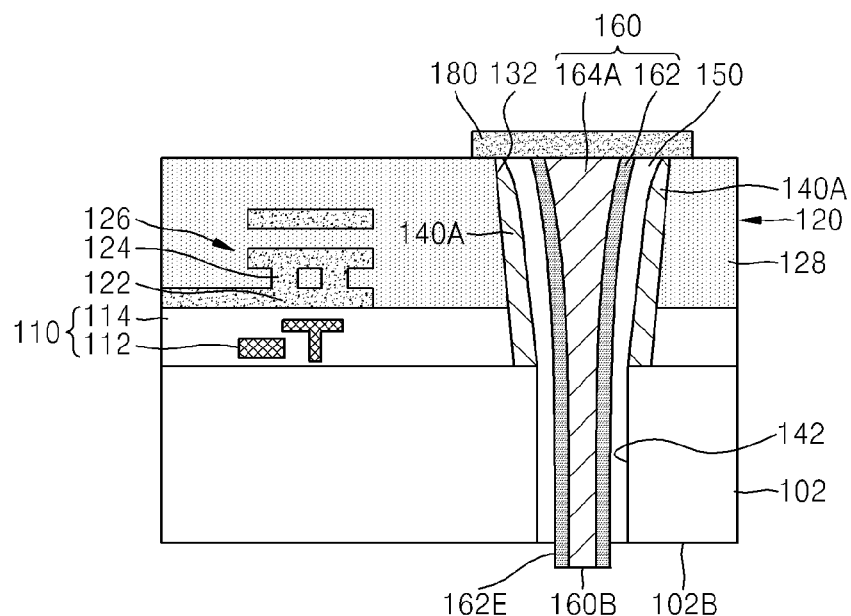
Figure 8O:
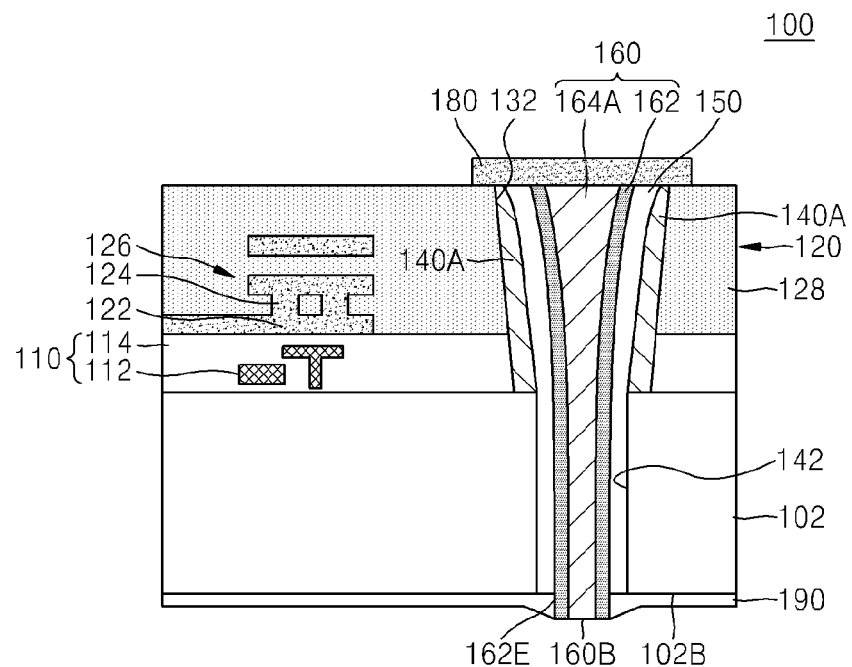

FIGS. 8A through 8O are cross-sectional views for explaining a method of manufacturing an integrated circuit device 100 (see FIG. 8O) according to a process order, according to an embodiment of the inventive concept.

Referring to FIG. 8A, a front-end-of-line (FEOL) structure 110 is formed on a substrate 102, and a back-end-of-line (BEOL) structure 120 is formed on the FEOL structure 110. Next, a polish-stop layer 129 is formed on the BEOL structure 120.

In one embodiment, the substrate 102 may be a semiconductor wafer. In at least one embodiment, the substrate 102 may include silicon (Si). Alternatively, the substrate 102 may include a semiconductor element such as germanium (Ge), or a compound semiconductor such as silicon carbide (SiC), gallium arsenide (GaAs), indium arsenide (InAs), or indium phosphide (InP). In at least one embodiment, the substrate 102 may have a silicon-on-insulator (SOI) structure. For example, the substrate 102 may include a buried oxide (BOX) layer. In an embodiment, the substrate 102 may include a conductive region, for example, a well doped with impurities or a structure doped with impurities. Also, the substrate 102 may have any of various device isolation structures such as a shallow trench isolation (STI) structure.

The FEOL structure 110 includes various types of individual devices 112, and an interlayer insulating film 114. The plurality of individual devices 112 may include various microelectronic devices, for example, a metal-oxide-semiconductor field effect transistor (MOSFET), a system large scale integration (LSI) circuit, an image sensor such as a CMOS imaging sensor (CIS), a micro-electro-mechanical system (MEMS), an active device, and a passive device. The plurality of individual devices 112 may be electrically connected to the conductive region of the substrate 102. Also, the plurality of individual devices 112 may be electrically separated from other neighboring individual devices by the interlayer insulating film 114.

The BEOL structure 120 includes a multi-layer wiring structure 126 that includes a plurality of wiring layers 122 and a plurality of contact plugs 124, and an inter-metal dielectric film 128 that insulates a part of the multi-layer wiring structure 126. The BEOL structure 120 may include a plurality of wiring structures for connecting the individual devices included in the FEOL structure 110 to other wiring lines. In some embodiments, the BEOL structure 120 may include a seal ring for protecting the multi-layer wiring structure 126 and structures disposed under the multi-layer wiring structure 126 from external impact or moisture.

The polish-stop layer 129 may be a silicon nitride film. The polish-stop layer 129 may be formed to have a thickness ranging from about 200 Å to about 1000 Å, but the present embodiment is not limited thereto. In order to form the polish-stop layer 129, CVD may be used.

Referring to FIG. 8B, a mask pattern 130 is formed on the polish-stop layer 129. A hole 130H, through which a part of a top surface of the first polish-stop layer 129 is exposed, is formed in the mask pattern 130.

In an embodiment, the mask pattern 130 may be formed of a photoresist material.

Referring to FIG. 8C, a first via hole 132, through which a top surface of the substrate 102 is exposed, is formed by sequentially etching the polish-stop layer 129 exposed through the hole 130H, and the inter-metal dielectric film 128 and the interlayer insulating film 114 disposed under the polish-stop layer 129 by using the mask pattern 130 as an etch mask.

Referring to FIG. 8D, the mask pattern 130 is removed.

In an embodiment, to prevent portions exposed through the first via hole 132, for example, insulating films formed of porous materials that are relatively easily damaged, from being damaged during the process of removing the mask pattern 130, the mask pattern 130 may be removed by using an organic strip process using an organic solvent 134 without an ashing process of the mask pattern 130. Examples of the organic solvent 134 may include, but are not limited to, 1-methyl-2-pyrrolidon (NMP) and dimethyl sulfoxide (DMSO).

Alternatively, to prevent damage to portions exposed through the first via hole 132 during the process of removing the mask pattern 130, a low temperature plasma ashing process and an organic strip process at a temperature ranging from about −20° C. to about 60° C. may be sequentially performed. Alternatively, to remove the mask pattern 130, an ashing process and an organic strip process using a $H_2/N_2$ gas may be sequentially performed. Alternatively, in order to remove the mask pattern 130, a strip process using an aqueous alkaline solution, for example, a 1-4% KOH or NaOH solution, may be performed.

Referring to FIG. 8E, a spacer layer 140 that covers inner side walls of the first via hole 132 and the exposed top surface of the polish-stop layer 129 is formed.

In an embodiment, the spacer layer 140 may be a silicon oxide film, a silicon nitride film, a silicon oxynitride film, an insulating metal oxide film, a high-k film, a polymer film, or a combination thereof.

Referring to FIG. 8F, an insulating spacer 140A that covers an inner side wall of the first via hole 132 may be formed by removing a part of the spacer layer 140 to expose the substrate 102 through a bottom surface of the first via hole 132.

The insulating spacer 140A may be formed in the first via hole 132 to have a ring-shaped cross-section as described above for the insulating spacer 50 of FIG. 1B. In an embodiment, the insulating spacer 140A may have a thickness TH ranging from about 100 Å to about 3000 Å.

Referring to FIG. 8G, a second via hole 142 that communicates with the first via hole 130 may be formed by etching the substrate 102 exposed through the insulating spacer 140A through a bottom surface of the first via hole 130 using the insulating spacer 140A, the polish-stop layer 129, and the inter-metal dielectric film 128 as an etch mask.

During the process of etching the substrate 102 to form the second via hole 142, sidewalls of the interlayer insulating film 114 and the inter-metal dielectric film 128 may be covered by the insulating spacer 140A and thus are not exposed to an etching atmosphere. Accordingly, even when the inter-metal dielectric film 128 includes a material film relatively vulnerable to damage due to an etching atmosphere, for example, a porous ULK film, there may be no risk that the inter-metal dielectric film 128 is damaged by the process of etching the substrate 102 to form the second via hole 142.

In some embodiments, a width 142W of the second via hole 142 may be controlled by an inner width 140W (e.g., a distance between opposing sidewalls of the lowermost portions of the insulating spacer 140A) of the insulating spacer 140A.

To form the second via hole 142, anisotropic etching or laser drilling may be used. In an embodiment, the second via hole 142 may be formed in the substrate 102 to have the horizontal width 142W of about 10 µm or less. In an embodiment, the second via hole 142 may be formed to have a depth ranging from about 50 µm to about 100 µm from the top surface of the substrate 102, but the present embodiment is not limited thereto.

Next, the resultant structure including the second via hole 142 may be cleaned by using an HF cleaning solution.

Since the cleaning process using the HF cleaning solution is performed after the inner wall of the first via hole 132 is covered by the insulating spacer 140A, even when the inter-metal dielectric film 128 includes a porous ULK film relatively vulnerable to damage due to the HF cleaning solution, the damage to the inter-metal dielectric film 128, resulting in the undesirable change in the dielectric constant of the inter-metal dielectric film 128 or damage to the profile of the inter-metal dielectric film 128 may be avoided.

Referring to FIG. 8H, a via insulating film 150 that covers inner walls of the first via hole 132 and the second via hole 142 is formed.

The via insulating film 150 is formed to cover a surface of the substrate 102 exposed in the second via hole 142, a surface of the insulating spacer 140A, and a surface of the polish-stop layer 129. The via insulating film 150 may have a substantially uniform thickness in the first via hole 132 and the second via hole 142, but the present embodiment is not limited thereto.

A TSV space 152 may be defined by the via insulating film 150 residing in the first via hole 132 and the second via hole 142.

In some embodiments, the via insulating film 150 may be an oxide film, a nitride film, a carbide film, a polymer, or a combination thereof. In an embodiment, in order to form the via insulating film 150, low temperature CVD or PECVD may be used. The via insulating film 150 may be formed to have a thickness ranging from about 1500 Å to about 2500 Å.

In an embodiment, the via insulating film 150 may be formed of the same material as that of the insulating spacer 140A. Alternatively, the via insulating film 150 may be formed of a material different from that of the insulating spacer 140A.

Referring to FIG. 8I, a conductive bather film 162 may be formed on the via insulating film 150 in the TSV space 152 in the first via hole 132 and the second via hole 142.

The conductive barrier film 162 may be formed in the first via hole 132 and the second via hole 142 to extend outside of the first via hole 132 and the second via hole 142. In order to form the conductive barrier film 162, PVD or CVD may be used.

The conductive barrier film 162 may have a substantially uniform thickness in longitudinal directions of the first via hole 132 and the second via hole 142, similar to the conductive bather film 34 of FIG. 1B. However, the present embodiment is not limited thereto.

The conductive bather film 162 may be a single film formed of one type of material, or a multi-layer film formed of at least two types of materials. In an embodiment, the conductive barrier film 162 may include at least one material selected from the group consisting of W, WN, WC, Ti, TiN, Ta, TaN, Ru, Co, Mn, WN, Ni, and NiB.

Referring to FIG. 8J, a conductive film such as a metal film 164 that fills the remaining space of the first via hole 132 and the second via hole 142 may be formed on the conductive bather film 162.

The metal film 164 may cover the conductive barrier film 162 inside and outside the first via hole 13.2 and the second via hole 142. The metal film 164 fills the remaining spaces of the first via hole 132 and the second via hole 142

In an embodiment, to form the metal film 164, electroplating may be used. In detail, after a metal seed layer (not shown) may be formed on a surface of the conductive barrier film 162, a metal film may be grown on the metal seed layer by using electroplating, and the metal film 164 that fills the first via hole 132 and the second via hole 142 may be formed on the conductive barrier film 162. The metal seed layer may be formed of Cu, a Cu alloy, Co, Ni, Ru, Co/CU, or Ru/Cu. To form the metal seed layer, PVD may be used. A main material of the metal film 164 may be Cu or W. In an embodiment, the metal film 164 may be formed of Cu, CuSn, CuM, CuNi, CuZn, CuPd, CuAu, CuRe, CuW, W, or a W alloy, but the present embodiment is not limited thereto. The electroplating may be performed at a temperature ranging from about 10° C. to about 65° C. For example, the electroplating may be performed at room temperature. After the metal film 164 is formed, the resultant structure including the metal film 164 may be annealed at a temperature ranging from about 150° C. to about 450° C. if necessary.

Referring to FIG. 8K, the polish-stop layer 129 is exposed by polishing the resultant structure of FIG. 8J including the metal film 164 by using, for example, chemical mechanical polishing (CMP) by using the polish-stop layer 129 as a CMP stopper.

As a result, portions of the via insulating film 150, the conductive barrier film 162, and the conductive film 164 disposed outside the first via hole 132 and the second via hole 142 are removed, and only a metal plug 164A that is a part of the conductive film 164 disposed on the conductive barrier film 162 inside the first via hole 1432 and the second via hole 142 remains.

Referring to FIG. 8L, the resultant structure including the metal plug 164A formed in the first via hole 132 and the second via hole 142 may be subjected to heat treatment. As a result, metal grains constituting the metal plug 164A may be grown due to the heat treatment, and a roughness on an exposed surface of the metal plug 164A may be degraded. Some of the metal particles grown due to the heat treatment which protrude to the outside of the first via hole 132 and the second via hole 142 are removed by using CMP. In this case, the polish-stop layer 129 (see FIG. 8K) is removed and a top surface of the inter-metal dielectric film 128 of the BEOL structure 120 is exposed.

The heat treatment may be performed at a temperature ranging from about 400° C. to about 500° C.

A TSV structure 160 including the conductive bather film 162 and the metal plug 164A remains in the first via hole 132 and the second via hole 142.

Referring to FIG. 8M, after the resultant structure of FIG. 8L including the TSV structure 160 is cleaned, a contact pad 180 electrically connected to the TSV structure 160 may be formed on the inter-metal dielectric film 128.

Referring to FIG. 8N, a bottom surface 160B of the TSV structure 160 may be exposed by removing a part of a back surface 102B of the substrate 102.

A part of the metal plug 164A and a part of the conductive bather film 162 may be exposed together through the bottom surface 160B of the TSV structure 160.

As shown in FIG. 8N, a part of the substrate 102 may be removed such that the bottom surface 160B of the TSV structure 160 protrudes from the back surface 102B of the substrate 102. In an embodiment, to remove the part of the back surface 102B of the substrate 102, CMP, etch-back, or a combination thereof may be used.

After the part of the back surface 102B of the substrate 102 is removed, the first via hole 132 and the second via hole 142 become through-holes that pass through the substrate 102, the interlayer insulating film 114, the inter-metal dielectric film 128. A part of the via insulating film 150 and a part of the TSV structure 160 may protrude together from the back surface 102B of the substrate 102. After the bottom surface 160B of the TSV structure 160 is exposed, a part of a side wall of an end portion 162E of the conductive barrier film 162 may be exposed by removing the via insulating film 150 that surrounds the TSV structure 160 around a portion of the TSV structure 160 which protrudes from the back surface 102B of the substrate 102, using isotropic etching or anisotropic etching.

Referring to FIG. 8O, the integrated circuit device 100 is formed by forming a backside insulating film 190 that covers the back surface 102B of the substrate 102 around the bottom surface 160B of the TSV structure 160.

In an embodiment, the backside insulating film 190 may be formed by using spin coating or spraying. The backside insulating film 190 may be formed of a polymer. In an embodiment, in order to form the backside insulating film 190, after a polymer film that covers the back surface 102B of the substrate 102 and the bottom surface 160B of the TSV structure 160 is formed, the bottom surface 160B of the TSV structure 160 may be exposed by performing etch-back on a part of the polymer film.

In the integrated circuit device 100 of FIG. 8O, the TSV structure 160 includes a side wall portion substantially surrounded by the substrate 102, another side wall portion that is substantially surrounded by the interlayer insulating film 114 of the FEOL structure 110, and still another side wall portion substantially surrounded by the inter-metal dielectric film 128 of the BEOL structure 120.

In an embodiment, the substrate 102, the FEOL structure 110, and the BEOL structure 120 may correspond to the semiconductor structure 20 of FIG. 1A, and the TSV structure 160 may correspond to the TSV structure 30 of FIG. 1A. A conductive layer (not shown) may be connected to the bottom surface 160B of the TSV structure 160. In an embodiment, the conductive layer formed on the bottom surface 160B of the TSV structure 160 may correspond to the conductive layer 54 of FIG. 1A.

Figure 9:
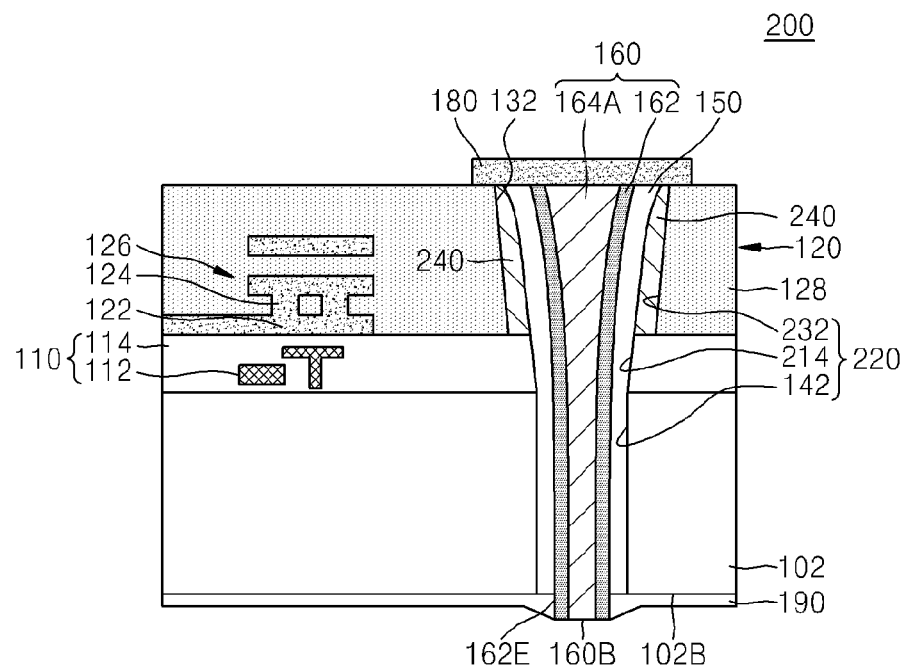
FIG. 9 is a cross-sectional view illustrating essential elements of an integrated circuit device, according to an embodiment of the inventive concept.

FIG. 9 is a cross-sectional view illustrating essential elements of an integrated circuit device 200, according to an embodiment of the inventive concept. In FIG. 9, the same elements as those in FIGS. 8A through 8O are denoted by the same reference numerals, and a detailed explanation thereof will not be given in order to avoid repetition.

In the integrated circuit device 200, a via hole 220, in which the TSV structure 160 is formed, includes a first via hole 232 that passes through the inter-metal dielectric film 128 of the BEOL structure 120, the second via hole 142 that passes through the substrate 102, and a third via hole 214 that passes through the interlayer insulating film 114 of the FEOL structure 110. The third via hole 214 is provided between and communicates with the first via hole 232 and the second via hole 142.

In the integrated circuit device 200, an insulating spacer 240 that covers an inner side wall of the first via hole 232 may be disposed between the via insulating film 150 that substantially surrounds the TSV structure 160 and the inter-metal dielectric film 128 of the BEOL structure 120. The insulating spacer 240 may not be disposed between the via insulating film 150 and the interlayer insulating film 114 of the FEOL structure 110. However, the present embodiment is not limited thereto, and the via insulating film 150 and the FEOL structure 110 may directly contact each other. In an embodiment, another insulating film (not shown) may be disposed between the via insulating film 150 and the FEOL structure 110.

The explanation of the insulating spacer 140 made with reference to FIGS. 8A through 8O may apply to the insulating spacer 240.

In an embodiment for manufacturing the integrated circuit device 200, a process similar to the process of forming the first via hole 132 described with reference to FIG. 8C may be performed. However, to form the first via hole 232, the inter-metal dielectric film 128 of the BEOL structure 120 is etched until the interlayer insulating film 114 is exposed. Next, after the insulating spacer 240 is formed on the inner side wall of the first via hole 232 by using a method similar to the method described with reference to FIGS. 8E and 8F, the third via hole 214 and the second via hole 142 are formed by etching the interlayer insulating film 114 and the substrate 102 by using a method similar to the method described with reference to FIG. 8G. Next, a series of processes similar to those described with reference to FIGS. 8H through 8O may be performed.

Figure 10:
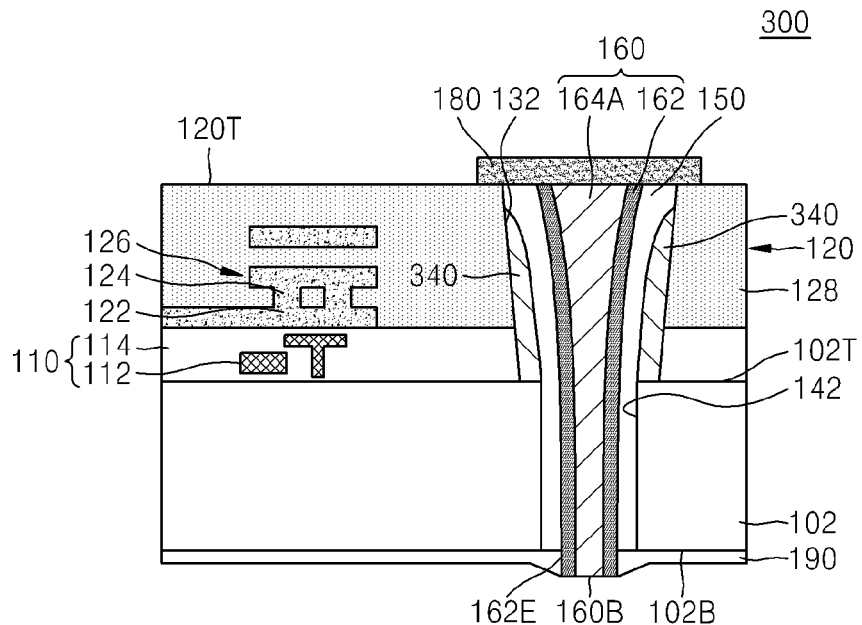
FIG. 10 is a cross-sectional view illustrating essential elements of an integrated circuit device, according to another embodiment of the inventive concept.

FIG. 10 is a cross-sectional view illustrating essential elements of an integrated circuit device 300, according to another embodiment of the inventive concept. In FIG. 10, the same elements as those in FIGS. 8A through 8O are denoted by the same reference numerals, and a detailed explanation thereof will not be given in order to avoid repetition.

In the integrated circuit device 300, an insulating spacer 340 extends along an inner side wall of the first via hole 132 from the top surface 102T of the substrate 102 to a level below that of an entrance of the first via hole 132, arranged near a top surface 120T of the BEOL structure 120.

The explanation of the insulating spacer 140 made with reference to FIGS. 8A through 8O may apply to the insulating spacer 340.

In an embodiment for manufacturing the integrated circuit device 300, a series of processes similar to those described with reference to FIGS. 8A through 8O may be performed. However, the insulating spacer 340 may be formed to have a height less than that of the insulating spacer 140A as shown in FIG. 10 by increasing an etch amount of the spacer layer 140 (see FIG. 8E) to be greater than that when the insulating spacer 140A of FIG. 8F is formed.

Figure 11:
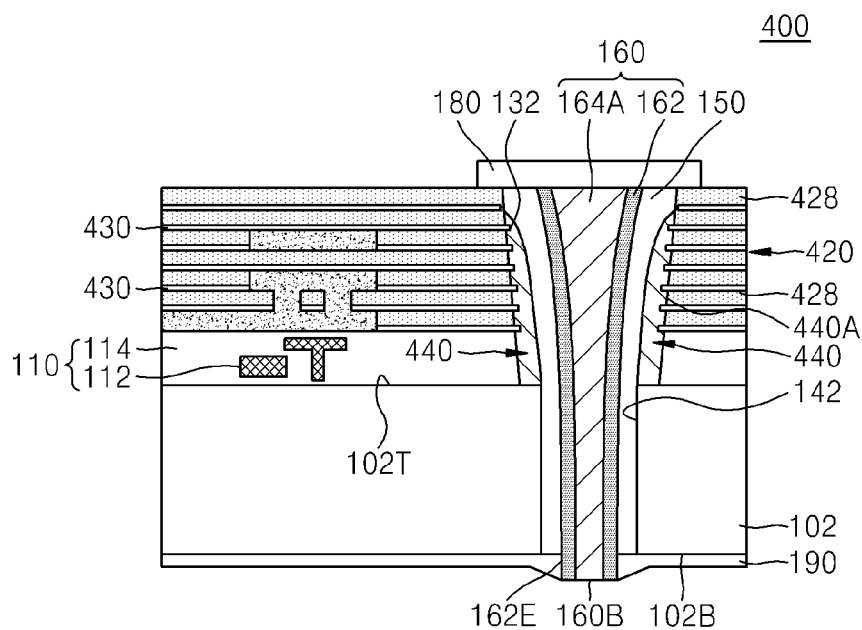
FIG. 11 is a cross-sectional view illustrating essential elements of an integrated circuit device, according to another embodiment of the inventive concept.

FIG. 11 is a cross-sectional view illustrating essential elements of an integrated circuit device 400, according to anther embodiment of the inventive concept. In FIG. 11, the same elements as those in FIGS. 8A through 8O are denoted by the same reference numerals, and a detailed explanation thereof will not be given in order to avoid repetition.

The integrated circuit device 400 has a similar structure to that of the integrated circuit device 300 of FIG. 10. However, in the integrated circuit device 400, a BEOL structure 420 includes a plurality of insulating films 428 and a plurality of polish-stop layers 430, and the plurality of insulating films 428 and the plurality of polish-stop layers 430 are alternately stacked. The plurality of insulating films 428 and the plurality of polish-stop layers 430 may have a structure similar to that of the insulating film 14N and polish stop layers 15N described with reference to FIG. 5.

An insulating spacer 440 may include an outer wall 440A that contacts the plurality of insulating films 428 and the plurality of polish-stop layers 430 constituting an inner wall of the first via hole 132, and the outer wall 440A may have a surface having an uneven, or tooth-like, shape corresponding to contact surfaces between the outer wall 440A and the insulating films 428 and the plurality of polish-stop layers 430.

Figure 12:
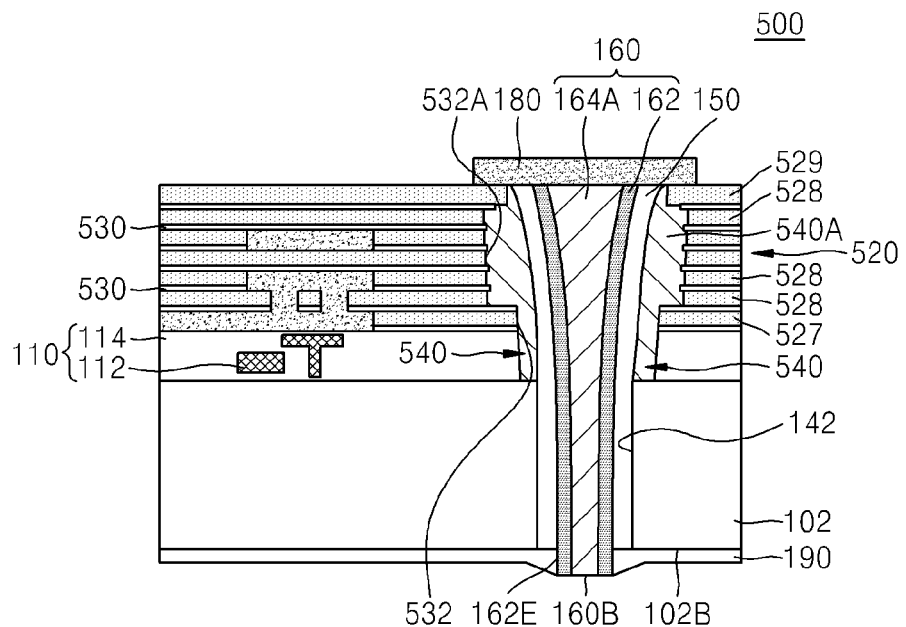
FIG. 12 is a cross-sectional view illustrating essential elements of an integrated circuit device, according to another embodiment of the inventive concept.

FIG. 12 is a cross-sectional view illustrating essential elements of an integrated circuit device 500, according to another embodiment of the inventive concept. In FIG. 12, the same elements as those in FIGS. 8A through 8O are denoted by the same reference numerals, and a detailed explanation thereof will not be given in order to avoid repetition.

The integrated circuit device 500 has a similar structure to that of the integrated circuit device 400 of FIG. 11. However, in the integrated circuit device 500, a BEOL structure 520 includes a plurality of insulating films 527, 528, and 529 and a plurality of polish-stop layers 530, which are alternately stacked. The plurality of insulating films 527, 528, and 529 and the plurality of polish-stop layers 530 may have a similar structure to that of the insulating film 14N described with reference to FIG. 5. In some embodiments, the insulating film 528 that is an intermediate layer from among the plurality of insulating films 527, 528, and 529 may have a dielectric constant higher than those of the insulating film 527 that is a lowermost layer and the insulating film 529 that is an uppermost layer. For example, the insulating film 528 may be a ULK film, for example, a SiOC film or a SiCOH film, and the insulating films 527 and 529 may be insulating films, for example, TEOS films, each having a dielectric constant lower than that of the ULK film.

The TSV structure 160 is formed in a first via hole 532 that passes through the plurality of insulating films 527, 528, and 529 and the plurality of polish-stop layers 530, and the second via hole 142 that passes through the substrate 102. A portion of the first via hole 532, through which sidewalls of the insulating film 528 and the polish-stop layer 530 are exposed, may have a width greater than that of a portion of the first via hole 532 through which the insulating films 527 and 529 are exposed. This is because while an etching process and a subsequent cleaning process for forming the first via hole 532 are performed, materials of the plurality of insulating films 527, 528, and 529 have different degrees of damage and removal rates. For example, the insulating film 528 may be a ULK film, for example, a SiOC film or a SiCOH film, and the insulating films 527 and 529 may be TEOS films. In this case, while an etching process for forming the first via hole 532, an ashing and strip process for removing an etch mask pattern, and a wet etching cleaning process are performed, removal rates of the insulating film 528 that is a porous ULK film that is easily damaged and the polish-stop layer 530 adjacent to the insulating film 528 and has a relatively low thickness may be higher than those of other portions. As a result, a portion of the first via hole 532 defined by the insulating film 528 has a width greater than a portion of the first via hole 532 defined by the insulating films 527 and 529, and thus the first via hole 532 having a cross-sectional profile as shown in FIG. 12 may be obtained. The first via hole 532 may have an inner wall 532A having an uneven shape due to uneven surfaces of the insulating film 528 and the polish-stop layer 530 adjacent to each other, defining a middle portion of the first via hole 532.

A portion of an insulating spacer 540 which contacts the inner wall 532A having the uneven shape includes an outer wall 540A that protrudes farther away from the TSV structure 160 than other portions. The protruding outer wall 540A may have an uneven, tooth-like shape corresponding to the uneven shape of the inner wall 532A.

To manufacture the integrated circuit device 500, a series of processes similar to those described with reference to FIGS. 8A through 8O may be performed. In particular, to form the first via hole 532 having the inner wall 532A having the uneven shape, the BEOL structure 520, instead of the BEOL structure 120 described with reference to FIG. 8A, may be formed. While an ashing process, or an ashing and strip process for removing the mask pattern 130 is performed in the process described with reference to FIG. 8D, a plurality of the insulating films 528 that are ULK films each having a relatively low dielectric constant in the BEOL structure 520 may be damaged or etched by a predetermined thickness from surfaces exposed through the first via hole 532, and such exposed portions may be removed through a subsequent wet cleaning process, thereby obtaining the inner wall 532A having the uneven shape. Next, the integrated circuit device 500 may be formed by performing a series of processes similar to those described with reference to FIGS. 8E through 8O.

Figure 13:
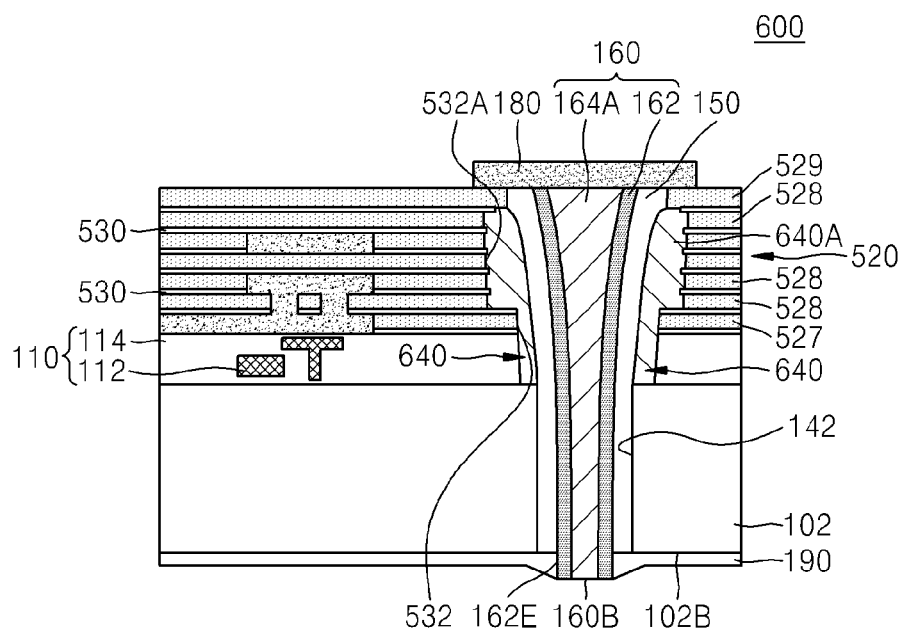
FIG. 13 is a cross-sectional view illustrating essential elements of an integrated circuit device, according to another embodiment of the inventive concept.

FIG. 13 is a cross-sectional view illustrating essential elements of an integrated circuit device 600, according to another embodiment of the inventive concept. In FIG. 13, the same elements as those in FIGS. 8A through 8O and FIG. 12 are denoted by the same reference numerals, and a detailed explanation thereof will not be given in order to avoid repetition.

The integrated circuit device 600 has a similar structure to that of the integrated circuit device 500 of FIG. 12. However, the integrated circuit device 600 includes an insulating spacer 640 that extends from the top surface 102T of the substrate 102 to a level lower than an entrance of the first via hole 532 near a top surface 520T of the BEOL structure 520 along an inner side wall of the first via hole 532, like the insulating spacer 340 of the integrated circuit device 300 of FIG. 10. The insulating spacer 640 may include an outer wall 640A having an uneven shape that protrudes farther away from the TSV structure 160, and which corresponds to the uneven shape of the inner wall 532A.

The explanation of the insulating spacer 140 made with reference to FIGS. 8A through 8O may apply to the insulating spacer 640.

Figure 14:
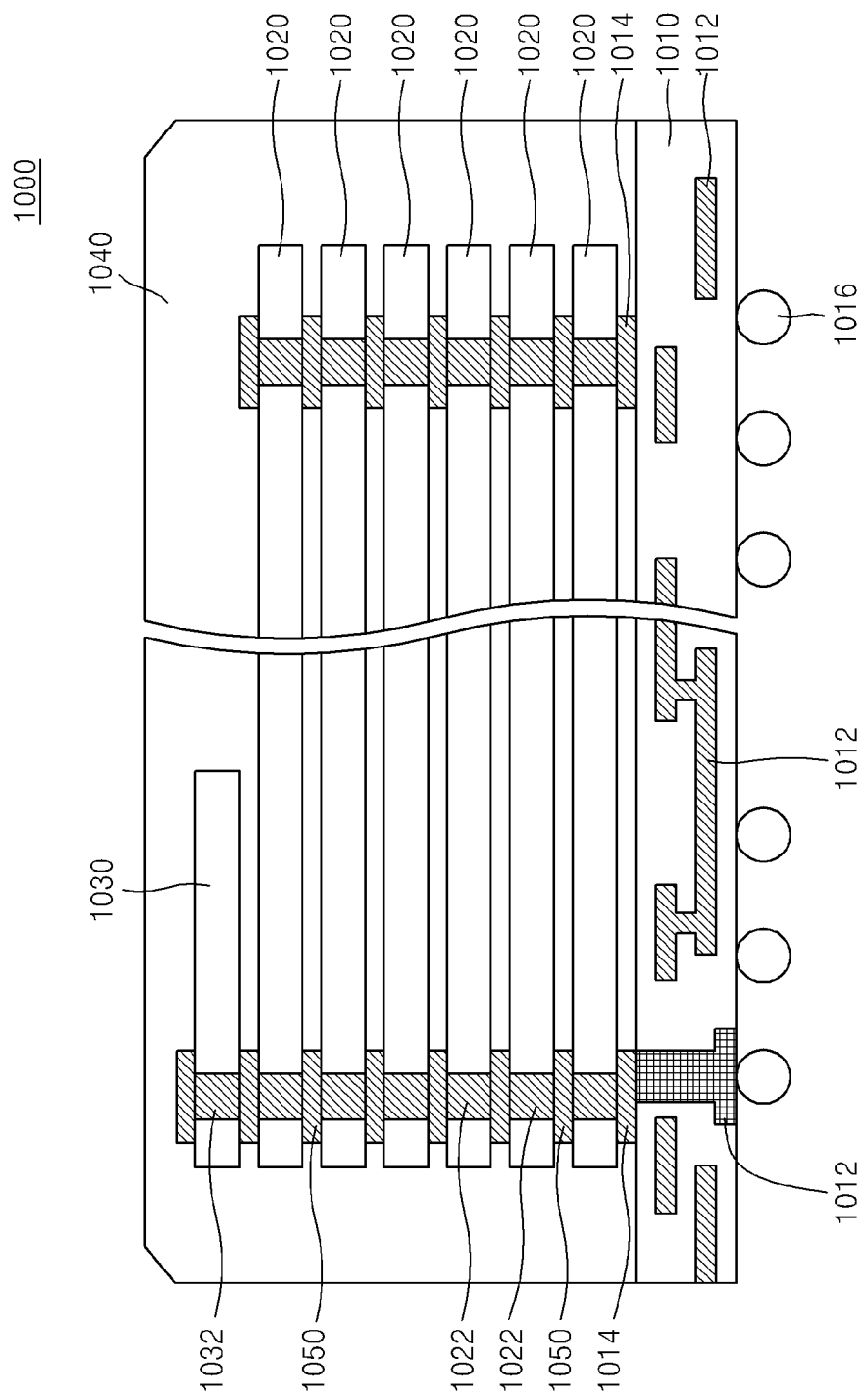
FIG. 14 is a cross-sectional view illustrating essential elements of an integrated circuit device, according to another embodiment of the inventive concept.

FIG. 14 is a cross-sectional view illustrating essential elements of an integrated circuit device 1000, according to another embodiment of the inventive concept.

Referring to FIG. 14, the integrated circuit device 1000 includes a plurality of semiconductor chips 1020 that are sequentially stacked on a package substrate 1010. A control chip 1030 is connected to the plurality of semiconductor chips 1020. A stacked structure of the plurality of semiconductor chips 1020 and the control chip 1030 may be sealed by an encapsulant 1040 such as a thermosetting resin on the package substrate 1010. Also, other types of encapsulants such as a ceramic casing may be used for an encapsulant. Although 6 semiconductor chips 1020 are vertically stacked in FIG. 12, the number of the semiconductor chips 1020 and directions in which the semiconductor chips 1020 are stacked are not limited thereto. The number of the semiconductor chips 1020 may be determined to be greater or less than 6. The plurality of semiconductor chips 1020 may be horizontally arranged on the package substrate 1010, or may be both horizontally and vertically arranged in a connected manner. In some embodiments, the control chip 1030 may be omitted.

The package substrate 1010 may include a flexible printed circuit board, a rigid printed circuit board, or a combination thereof. The package substrate 1010 includes a substrate internal wiring line 1012, and a connection terminal 1014. The connection terminal 1014 may be formed on one surface of the package substrate 1010. Solder balls 1016 may be formed on the other surface of the package substrate 1010. The connection terminal 1014 is electrically connected to the solder balls 10"16 through the substrate internal wiring line 1012. The solder balls 1016 may be replaced by conductive bumps or a lead grid array (LGA).

TSV structures 1022 and 1032 of the plurality of semiconductor chips 1020 and the control chip 1030 may be electrically connected to the connection terminal 1014 of the package substrate 1010 by using a connection member 1050 such as bumps. In an embodiment, the TSV structure 1032 may be omitted from the control chip 1030.

At least one of the plurality of semiconductor chips 1020 and the control chip 1030 includes at least one of the integrated circuit devices 10A, 10B, 10C, 10D, 10E, 100, 200, 300, 400, 500, and 600 described with reference to FIGS. 1A through 13.

Each of the plurality of semiconductor chips 1020 may include a system LSI circuit, a flash memory, a dynamic random access memory (DRAM), a static random access memory (SRAM), an electrically erasable programmable read-only memory (EEPROM), a phase-change random access memory (PRAM), a magnetoresistive random access memory (MRAM), or a resistive random access memory (RRAM). The control chip 1030 may include logic circuits such as serializer/deserializer (SER/DES) circuits.

Figure 15:
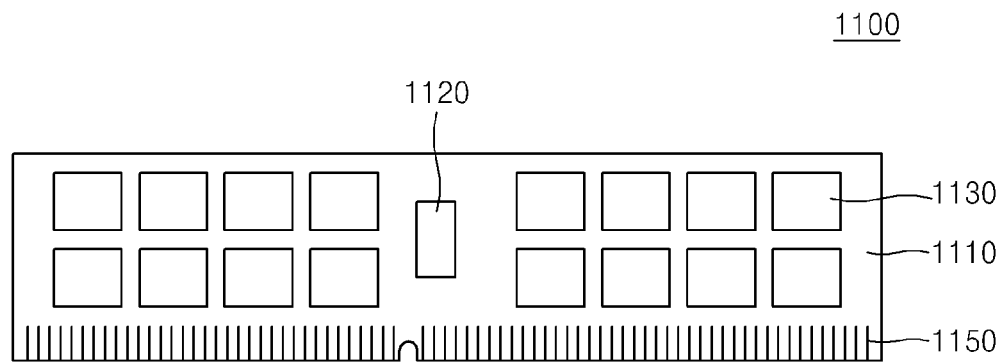
FIG. 15 is a cross-sectional view illustrating essential elements of an integrated circuit device, according to another embodiment of the inventive concept.

FIG. 15 is a plan view illustrating essential elements of an integrated circuit device 1100, according to another embodiment of the inventive concept.

The integrated circuit device 1100 includes a module substrate 1110, and a control chip 1120 and a plurality of semiconductor packages 1130 that are mounted on the module substrate 1110. A plurality of input/output terminals 1150 are formed on the module substrate 1110.

Each of the plurality of semiconductor packages 1130 includes at least one of the integrated circuit devices 10A, 10B, 10C, 10D, 10E, 100, 200, 300, 400, 500, and 600 described with reference to FIGS. 1A through 13.

Figure 16:
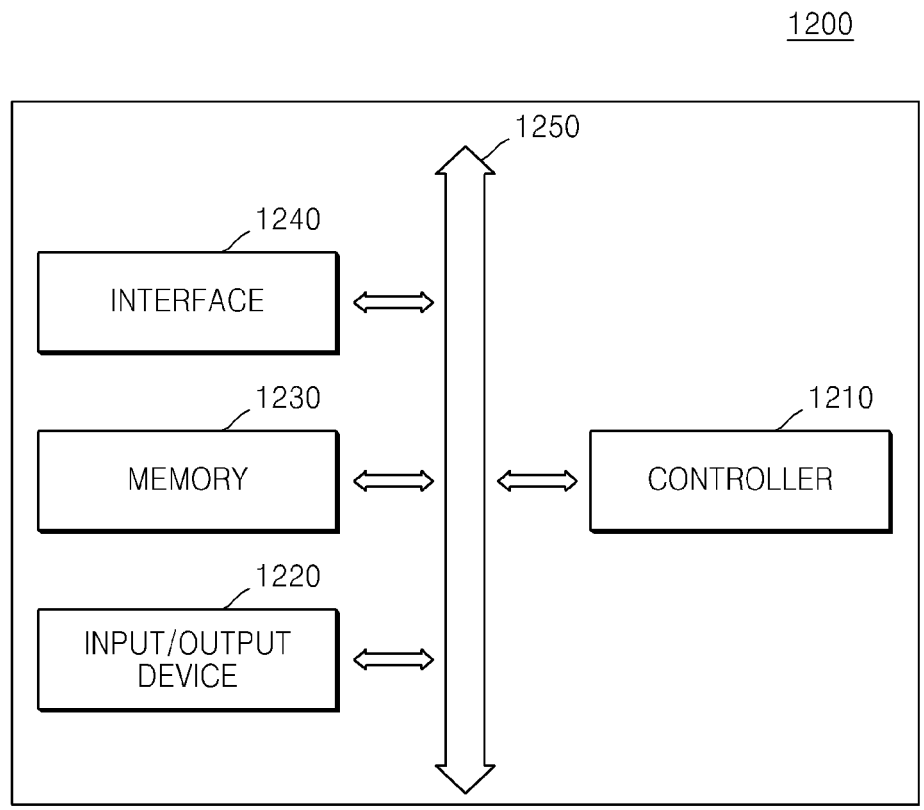
FIG. 16 is a diagram illustrating essential elements of an integrated circuit device, according to an embodiment of the inventive concept.

FIG. 16 is a diagram illustrating essential elements of an integrated circuit device 1200, according to another embodiment of the inventive concept.

The integrated circuit device 1200 includes a controller 1210, an input/output device 1220, a memory 1230, and an interface 1240. The integrated circuit device 1200 may be a mobile system or a system that transmits or receives information. In an embodiment, the mobile system may be at least one of a personal digital assistant (PDA), a mobile computer, a web tablet, a wireless phone, a mobile phone, a digital music player, and a memory card.

In an embodiment, the controller 1210 is a microprocessor, a digital signal processor, or a microcontroller.

The input/output device 1220 is used to input/output data into/from the integrated circuit device 1200. The integrated circuit device 1200 may be connected to an external device, for example, a personal computer or a network, by using the input/output device 1220, and may exchange data with the external device. In an embodiment, the input/output device 1220 is a keypad, a keyboard, or a display device.

In an embodiment, the memory 1230 stores code and/or data for operating the controller 1210. Alternatively, the memory 1230 stores data processed by the controller 1210. At least one of the controller 1210 and the memory 1230 includes at least one of the integrated circuit devices 10A, 10B, 10C, 10D, 10E, 100, 200, 300, 400, 500, and 600 described with reference to FIGS. 1A through 13.

The interface 1240 acts as a data transmission path between the integrated circuit device 1200 and another external device. The controller 1210, the input/output device 1220, the memory 1230, and the interface 1240 may communicate with one another via a bus 1250.

The integrated circuit device 1200 may be included in a mobile phone, an MP3 player, a navigation system, a portable multimedia player (PMP), a solid-state disk (SSD), or a household appliance.

According to the inventive concept, an integrated circuit device includes a via insulating film that surrounds a TSV structure that passes through a substrate and an insulating layer, and an insulating spacer that is formed on the substrate to be disposed between the via insulating film and the insulating film. The insulating spacer is formed to cover the insulating film that is exposed through a via hole for forming the TSV structure. Since the insulating spacer that covers the insulating film is formed before the via hole that passes through the substrate is formed, when the substrate is etched to form the via hole that passes through the substrate and when a wet cleaning process for cleaning the substrate exposed through the via hole is performed, the insulating film that is vulnerable to damage may be protected by the insulating spacer. Accordingly, the problem that when the via hole for forming the TSV structure is formed, the insulating film is damaged or deteriorates and thus a dielectric constant is changed or a profile of the insulating film is degraded may be avoided.

While the inventive concept has been particularly shown and described with reference to exemplary embodiments thereof, it will be understood that various changes in form and details may be made therein without departing from the spirit and scope of the following claims.

What is claimed is:

1. An integrated circuit device comprising:
 a semiconductor structure comprising a substrate and an interlayer insulating film;
 a through-silicon-via (TSV) structure formed in a via hole passing through the substrate and the interlayer insulating film;
 a via insulating film passing through the substrate and the interlayer insulating film and substantially surrounding the TSV structure; and
 an insulating spacer disposed between the interlayer insulating film and the via insulating film,
 wherein the insulating spacer is formed in only a part of the via hole located in the interlayer insulating film.

2. The integrated circuit device of claim 1, wherein the interlayer insulating film has a multi-layer structure in which a plurality of insulating films formed of different materials are stacked, and the insulating spacer contacts each of the plurality of insulating films.

3. An integrated circuit device comprising:
 a semiconductor structure comprising a semiconductor substrate and an interlayer insulating film;
 a through-silicon-via (TSV) structure formed in a via hole passing through the semiconductor substrate and the interlayer insulating film;
 a via insulating film disposed in the via hole and substantially surrounding the TSV structure; and
 an insulating spacer disposed between the interlayer insulating film and the via insulating film, the insulating spacer substantially surrounding the TSV structure,
 wherein the insulating spacer is formed in only a part of the via hole formed in the interlayer insulating film.

4. The integrated circuit device of claim 3, wherein the interlayer insulating film comprises a first insulating film and a second insulating film that have different dielectric constants and respectively define widths of the via hole, and
 wherein a first horizontal width of a portion of the via hole defined by the first insulating film and a second horizontal width of a portion of the via hole defined by the second insulating film are different from each other.

5. The integrated circuit device of claim 3, wherein the interlayer insulating film comprises a first insulating film having a first dielectric constant, and a second insulating film having a second dielectric constant higher than the first dielectric constant, and
wherein the via hole comprises a first hole portion defined by the first insulating film and a second hole portion defined by the second insulating film, and the second hole portion has a width greater than a width of the first hole portion.

6. The integrated circuit device of claim 3, wherein the interlayer insulating film has a multi-layer structure in which a first insulating film having a first dielectric constant and a second insulating film having a second dielectric constant higher than the first dielectric constant are alternately stacked a plurality of times, and
wherein the via hole comprises a first via hole defined by the multi-layer structure and having an inner wall having an uneven shape, and a second via hole communicated with the first via hole.

7. The integrated circuit device of claim 3, wherein the interlayer insulating film comprises a first insulating film and a second insulating film formed of different materials respectively define widths of the via hole,
wherein the insulating spacer comprises a first outer wall portion in contact with the first insulating film, and a second outer wall portion in contact with the second insulating film, and
wherein horizontal distances of the first outer wall portion and the second outer wall portion from the TSV structure are different from each other.

8. The integrated circuit device of claim 3, wherein the interlayer insulating film comprises a first insulating film having a first dielectric constant, and a second insulating film having a second dielectric constant higher than the first dielectric constant,
wherein the insulating spacer comprises a first outer wall portion in contact with the first insulating film, and a second outer wall portion in contact with the second insulating film, and
wherein the second outer wall portion horizontally protrudes outward farther away from the TSV structure than the first outer wall portion.

9. The integrated circuit device of claim 3, wherein the interlayer insulating film has a multi-layer structure in which a first insulating film and a second insulating film formed of different materials are alternately stacked a plurality of times, and
wherein the insulating spacer has an outer wall having an uneven shape, the outer wall in contact with the multi-layer structure.

10. The integrated circuit device of claim 3, wherein the insulating spacer covers at least a part of a vertical length extending from a top surface of the semiconductor substrate to an entrance of the via hole near a top surface of the interlayer insulating film.

11. The integrated circuit device of claim 3, wherein the insulating spacer extends along a surface of the interlayer insulating film facing an inside of the via hole from a top surface of the semiconductor substrate to an entrance of the via hole.

12. The integrated circuit device of claim 3, wherein the insulating spacer extends along a surface of the interlayer insulating film facing an inside of the via hole from a top surface of the semiconductor substrate to a level lower than an entrance of the via hole.

13. The integrated circuit device of claim 3, wherein the via hole comprises a first via hole passing through the interlayer insulating film, and a second via hole passing through the semiconductor substrate and in communication with the first via hole, and
wherein a first width of a portion of the first via hole closest to the semiconductor substrate and a second width of a portion of the second via hole closest to the interlayer insulating film are different from each other.

14. The integrated circuit device of claim 13, wherein the second width is smaller than the first width.

15. The integrated circuit device of claim 3, wherein a first length of the insulating spacer is less than a second length of the via insulating film in a longitudinal direction of the via hole.

16. A device comprising:
a semiconductor substrate;
an insulating film formed on the semiconductor substrate;
a via hole extending through the semiconductor substrate and the insulating film;
a contact plug extending through the via hole;
a via hole insulating layer substantially surrounding the contact plug; and
an insulating spacer between the via hole insulating layer and the insulating film, the insulating spacer extending along only a portion of a sidewall of the via hole.

17. The device of claim 16, further comprising a conductive barrier between the contact plug and the via hole insulating layer, the conductive barrier substantially surrounding the contact plug.

18. The device of claim 16, wherein a bottom surface of the insulating spacer is contiguous with a top surface of the semiconductor substrate.

19. The device of claim 18, wherein a top of the insulating spacer is spaced apart from a top surface of the insulating film.

20. The device of claim 16, wherein a top of the insulating spacer extends to a top surface of the insulating film.

* * * * *